US007015546B2

(12) United States Patent
Herr et al.

(10) Patent No.: US 7,015,546 B2
(45) Date of Patent: Mar. 21, 2006

(54) DETERMINISTICALLY DOPED FIELD-EFFECT DEVICES AND METHODS OF MAKING SAME

(75) Inventors: Daniel Joseph Christian Herr, Chapel Hill, NC (US); Victor Vladimirovich Zhirnov, Raleigh, NC (US)

(73) Assignee: Semiconductor Research Corporation, Durham, NC (US)

( * ) Notice: Subject to any disclaimer, the term of this patent is extended or adjusted under 35 U.S.C. 154(b) by 7 days.

(21) Appl. No.: 10/604,747

(22) Filed: Aug. 14, 2003

(65) Prior Publication Data

US 2004/0132254 A1 Jul. 8, 2004

Related U.S. Application Data

(63) Continuation-in-part of application No. 09/510,802, filed on Feb. 23, 2000, now Pat. No. 6,664,559.
(60) Provisional application No. 60/407,542, filed on Aug. 30, 2002.

(51) Int. Cl.
*H01L 31/119* (2006.01)

(52) U.S. Cl. ...................... 257/345; 257/402; 257/403; 257/404; 977/DIG. 1
(58) Field of Classification Search ............ 977/DIG. 1; 438/149, 163, 289, 291; 257/349, 345, 402–404, 257/66, 347
See application file for complete search history.

(56) References Cited

U.S. PATENT DOCUMENTS

| | | | |
|---|---|---|---|
| 5,787,253 A | | 7/1998 | McCreery et al. |
| 5,841,170 A | * | 11/1998 | Adan et al. .................. 257/345 |
| 5,981,316 A | | 11/1999 | Yamada et al. |
| 6,068,698 A | * | 5/2000 | Schmidt ....................... 117/84 |

(Continued)

FOREIGN PATENT DOCUMENTS

| | | |
|---|---|---|
| EP | 0781727 | 2/1997 |
| WO | 99/13511 | 3/1999 |
| WO | WO 01/63674 | 8/2001 |

OTHER PUBLICATIONS

Nanomechanical memory cell could catapult efforts to improve data storage, Nanotechnolgy Now, Sep. 30, 2004. http://www.nanotech-now.com/news.cgi?story_id= 05973.*
Popok et al., New Direction in Nanotechnology: Cluster Ion Beam Technique, 2003 13$^{th}$ International Conference "Microwave & Telecommunication Technology", Sep. 8–12, Sevastopol, Crimea, Ukraine, pp. 253–255.*
Rangelow et al., Concept of an ion implantation stage with atomic resolution., Abstract only, Mar. 31, 2004.*

(Continued)

*Primary Examiner*—M. Wilczewski
(74) *Attorney, Agent, or Firm*—Moore & Van Allen PLLC; Steven B. Phillips

(57) ABSTRACT

Deterministically doped field-effect devices and methods of making same. One or more dopant atoms, also referred to as impurities or impurity atoms, are arranged in the channel region of a device in engineered arrays. Component atoms of an engineered array are substantially fixed by controlled placement in order to provide a barrier topology designed to control of source-drain carrier flow to realize an ultra-small device with appropriate, consistent performance characteristics. Devices can be made by placing atoms using proximity probe manipulation, ion implantation, by facilitating self-assembly of the atoms as necessary, or other techniques. These atomic placement techniques are combined in example embodiments with traditional methods of forming a substrate, insulators, gates, and any other structural elements needed in order to produce practical field-effect devices.

31 Claims, 16 Drawing Sheets

U.S. PATENT DOCUMENTS

| | | | | |
|---|---|---|---|---|
| 6,127,702 | A | * 10/2000 | Yamazaki et al. | 257/347 |
| 6,306,709 | B1 | * 10/2001 | Miyagi et al. | 438/276 |
| 6,380,036 | B1 | * 4/2002 | Oda et al. | 438/289 |
| 6,498,376 | B1 | * 12/2002 | Miyagi et al. | 257/392 |
| 6,586,785 | B1 | * 7/2003 | Flagan et al. | 257/261 |
| 6,617,647 | B1 | * 9/2003 | Yamazaki | 257/349 |
| 6,706,597 | B1 | * 3/2004 | Geusic et al. | 438/260 |
| 6,756,236 | B1 | * 6/2004 | Ford et al. | 438/3 |
| 6,791,338 | B1 | * 9/2004 | Bratkovski et al. | 324/600 |
| 2002/0066915 | A1 | * 6/2002 | Ford et al. | 257/295 |
| 2002/0130311 | A1 | * 9/2002 | Lieber et al. | 257/1 |
| 2003/0047796 | A1 | * 3/2003 | Bao et al. | 257/632 |
| 2003/0098488 | A1 | * 5/2003 | O'Keeffe et al. | 257/401 |
| 2004/0075123 | A1 | * 4/2004 | Fraboulet et al. | 257/288 |
| 2004/0132254 | A1 | * 7/2004 | Herr et al. | 438/291 |
| 2004/0150024 | A1 | * 8/2004 | Mazoyer et al. | 257/298 |

OTHER PUBLICATIONS

Kane, V.E., "A Silicon–Based Nuclear Spin Quantum Computer", Nature, Macmillan Journals Ltd., vol. 393, No. 6681 (1998) pp. 133–137.

Obrien, J. L. et al., "Towards the Fabrication of Phosphorus Qubits for a Silicon Quantum Computer", Physical Review, B. Condensed Matter, American Institute of Physics, vol. 64, No. 21, (Mar. 18, 2001) pp. 161401–1.

Vrijen, R. et al., "Electron–spin–resonance Transistors for Quantum Computing in Silicon–Germanium Heterostructures", Physical Review A (Atomic, Molecular, And Optical Physics) APS Through AIP USA, vol. 62, No. 1, (Jun. 13, 2000) pp. 012306/1–10.

Kane, B.E. et al., "Single–Spin Measurement Using Single–Electron Transistors to Prove Two–Electron Systems", Physical Review, B. Condensed Matter, American Institute of Physics, vol. 61, No. 4 (Jan. 15, 2000) pp. 2961–2972.

Shen, T–C et al., "Ultradense phosphorous Delta Layers Grown Intro Silicon From $PH_3$ molecular Precursors", Applied Physics Letters, American Institute of Physics, vol. 80, No. 9 (Mar. 4, 2002) pp. 1580–1582.

Jamieson, D.N. et al., "A Role for Ion Implantation in Quantum Computing", Nuclear Instruments & Methods in Physics Research, Selection—B: Beam Interactions with Materials and Atoms, vol. 175–177, (Apr. 2004) pp. 7–22.

Semiconductor Research Corporation, International Search Report, PCT/US03/26560, Mar. 10, 2005.

D. M. Eigler et al., "Positioning single atoms with a scanning tunnelling microscope", Nature, vol. 344 (Apr. 1990) pp 524–526.

P. Bedrossian et al., "Demonstration of the tunnel–diode effect on an atomic", scale, Nature, vol. 342 (Nov. 1989) pp 258–260.

Nishi Y. et al., Handbook of Semiconductor Manufacturing Technology, Marcel Dekker, Inc. New York, NY (2000).

Frank, D. et al., "Device Scaling Limits of SiMOSFETs and Their Application Dependencies," Proceedings of the IEEE, vol. 89, No. 3, (Mar. 2001).

Gross, W. et al., "Ultrasmall MOSFETs: The Iimportance of the full Coulomb Interaction on Device Characteristics," IEEE Transactions on Electron Devices, vol. 47, No. 10, (Oct. 2000).

Clark, A., "Russian Technology Waves Goodbye to Strained Silicon," EE Times, (Apr. 8, 2002).

Feynman, R.P., Infinitesimal Machinery, Journal of Micro-Mechanical Systems, vol. 2, No. 1, Mar. 1993, pp. 4–14.

Feynman, R.P., "There's Plenty of Room at the Bottom", Engineering and Science, vol. 23, 1960, pp. 22–36, Reprinted in Anthony J.G. Hey (Ed.), Feynman and Computation: Exploring the Limits of Computers Perseus Books 1999.

Giro, et al., "Single Layer Electroluminescent Devices Based on Molecularly Doped Polymer", (MDP) Films, Synthetic Metals, vol. 84, 1997, pp. 379–380.

Johnson, et al., "Electroluminescence From Single Layer Molecularly Doped Polymer Films", SPIE, vol. 1910, 1993, pp. 6–14.

Metzger, R.M., "Electrical Rectification by a Molecule: The Advent of Unimolecular Electronic Devices", Accounts of Chemical Research, vol. 32, No. 11, 1999, pp. 950–957.

Nikzad, et al., "Direct Detection and Imaging of Low–Energy Electrons With Delta–Doped Charge–Coupled Devices", Applied Physics Letters, vol. 73, No. 23, Dec. 7, 1998, pp. 3417–3419.

Stormer, et al., "GaAs Field–Effect Transistor With An Atomically Precise Ultrashort Gate", Appl. Phys. Lett., vol. 59, No. 9, Aug. 26, 1991, pp. 1111–1113.

Tucker, et al., "Prospects for Atomically Ordered Device Structures Based on STM Lithography", Solid–State Electronics, vol. 42, No. 7–8, 1998, pp. 1061–1067.

Zaknoune, et al., "High–Power V–Band $Ga_{0.51}In_{0.49}P/In_{0.2}Ga_{0.8}As$ Pseudomorphic HEMT Grown by Gas Source Molecular Beam Epitaxy", IEEE Microwave and Guided Wave Letters, vol. 9, No. 1, Jan. 1999 pp. 28–30.

Saito, S. et al., "Electronic Structure of Si20 and C20 Fulleries," Proceedings of the Symposium on Recent Advances in the Chemistry and Physics of Fullerenes and Related Materials, vol. 3, pp. 457–461, 1996.

Cavin, R. et al., "Semiconductor research needs in the nanoscale physical sciences: a Semiconductor Research Corporation working paper," Journal of Nanoparticle Research 2; pp. 213–235; 2000.

Ozin, Geoffrey A.; "Nanochemistry: Synthesis in Diminishing Dimensions," Advanced Materials 4, No. 10; pp. 612–649; 1992.

Desiraju, G.R. (Ed.), "Thoughts on Crystals as Supramolecules", The Crystal as a Supramolecular Entity, John Wiley and Sons Ltd., 1996.

Zhirnov et al., "On Designing Sub–70–nm Semiconductor Materials and Processes," IEEE Transactions on Semiconductor Manufacturing, vol. 15, No. 2 (May 2002).

* cited by examiner

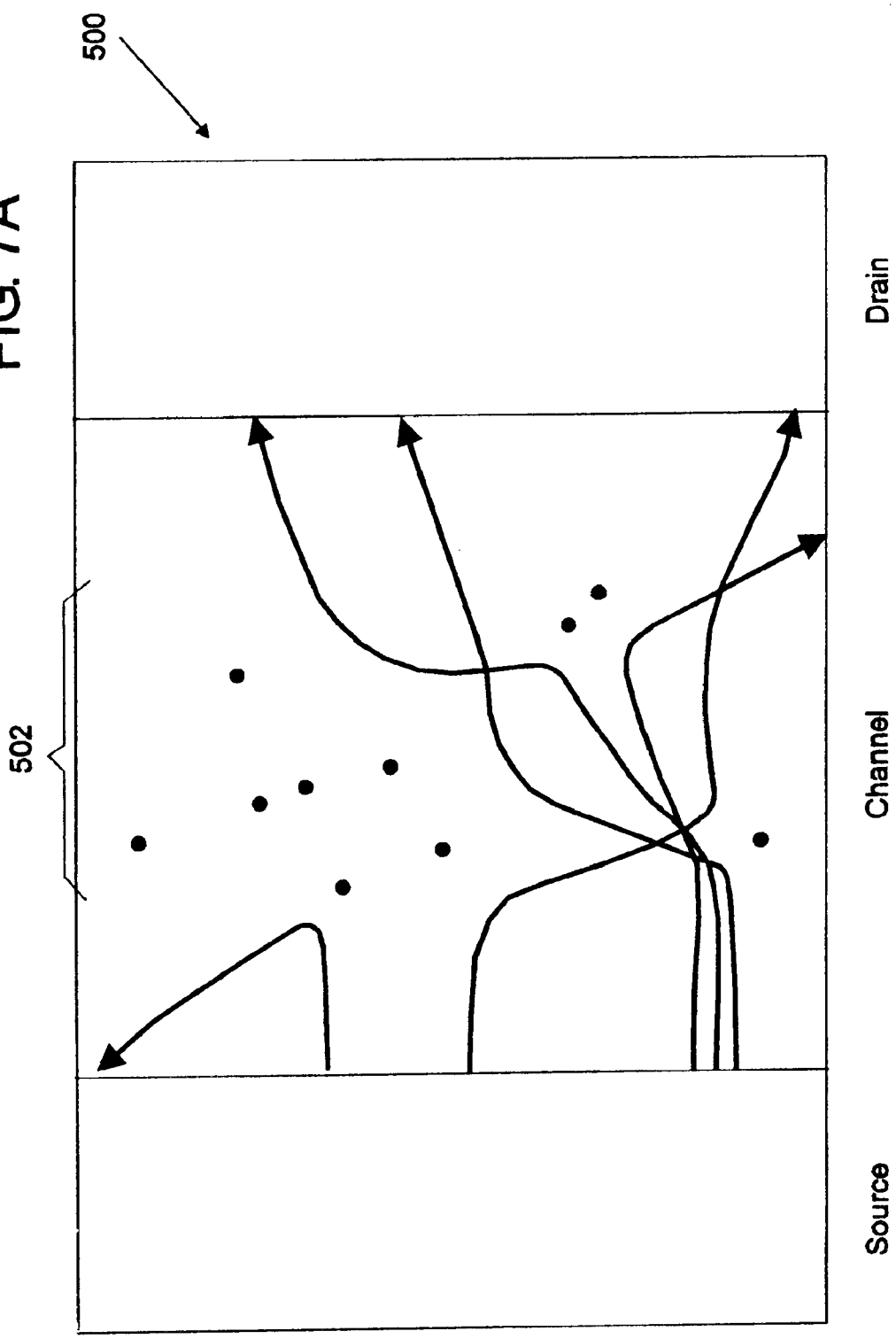

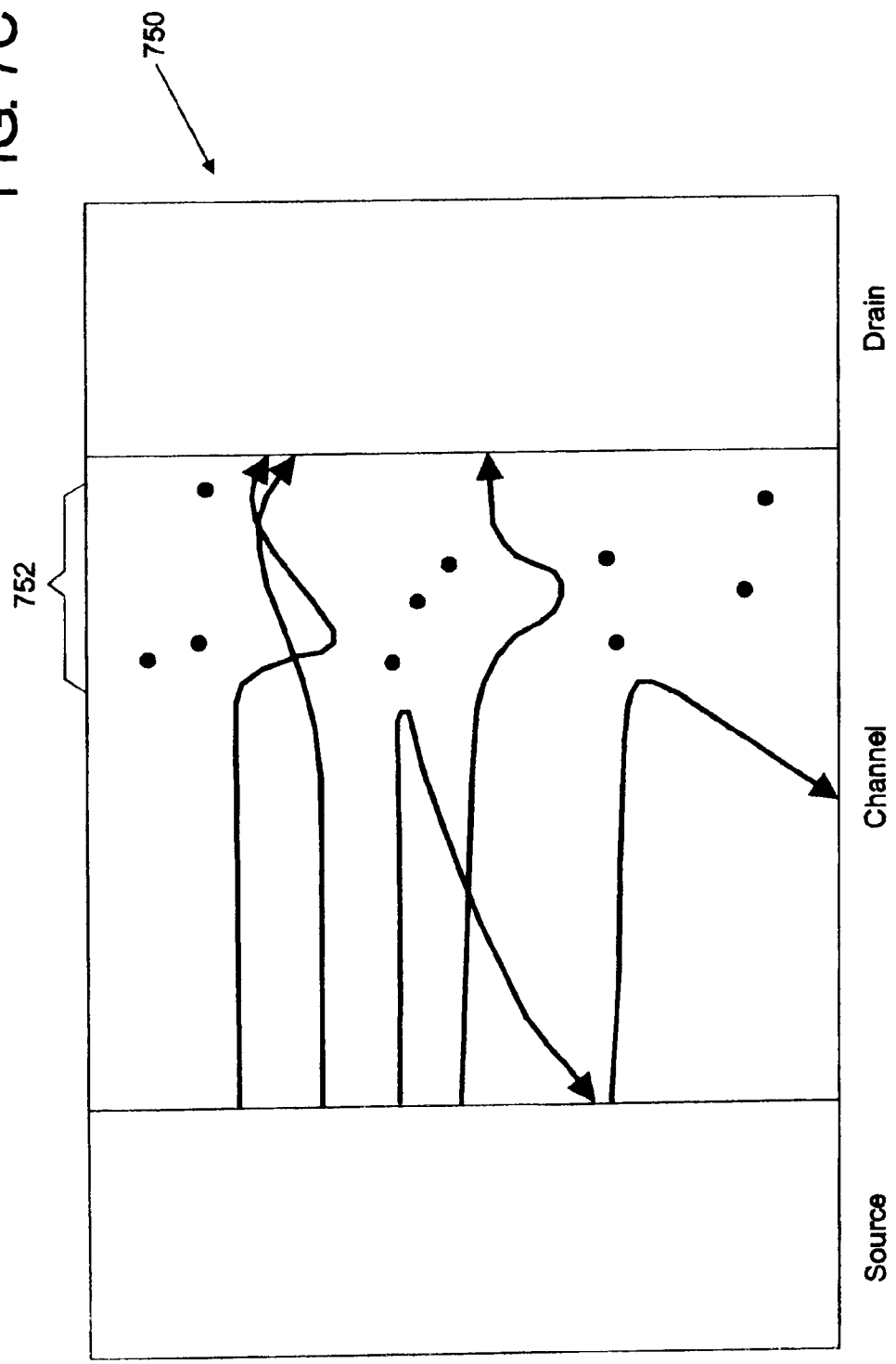

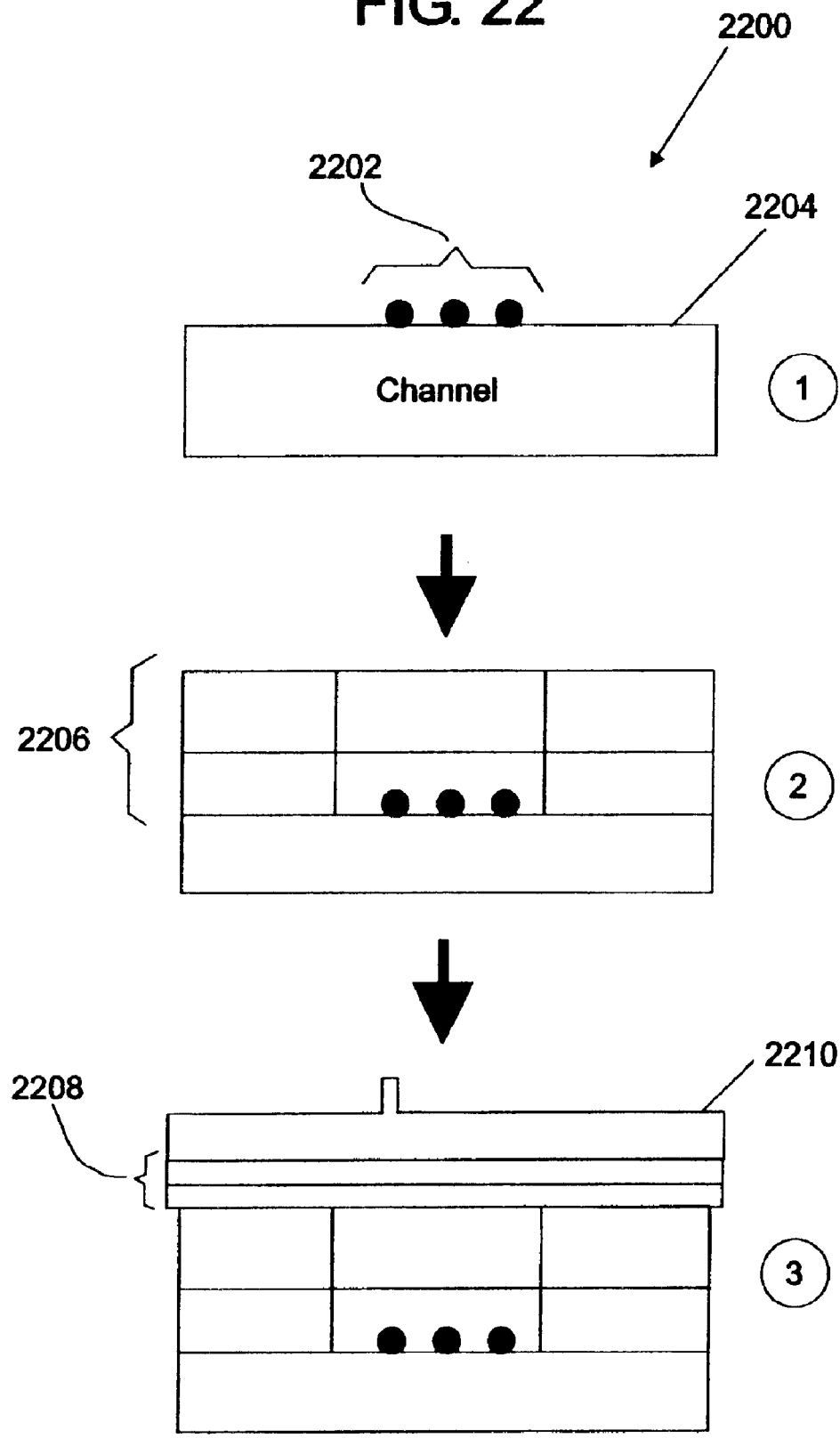

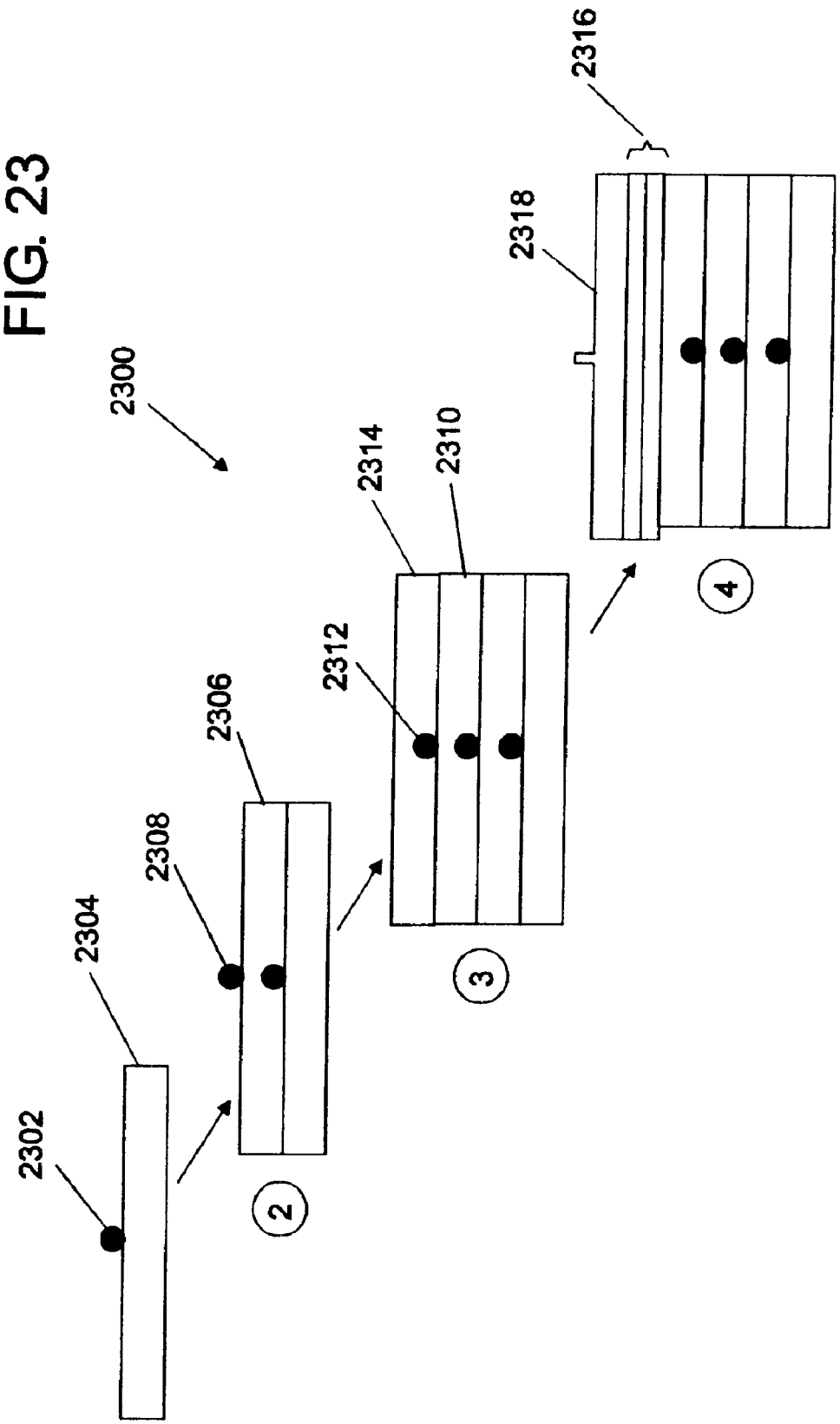

DETERMINISTICALLY DOPED FIELD-EFFECT DEVICES AND METHODS OF MAKING SAME

CROSS REFERENCE TO RELATED APPLICATIONS

This application is a continuation-in-part of and claims priority from commonly owned, U.S. application Ser. No. 09/510,802, filed Feb. 23, 2000, now U.S. Pat. No. 6,664,559 the entire disclosure of which is incorporated herein by reference. This application claims priority from commonly owned, U.S. Provisional Application Ser. No. 60/407,542, filed Aug. 30, 2002, the entire disclosure of which is incorporated herein by reference.

(ITRS), the thickness of the retrograde doping layer is less than 10 nm and 5 nm at the 80 nm and 32 nm technology nodes, respectively. The purpose of the retrograde layer is to create a thin, lightly doped region of high mobility on top of a heavily doped, lower-mobility layer. In conventional, stochastically doped devices, carrier scattering increases and mobility decreases with the number of dopant atoms in the channel. Conventional super steep retrograde doped devices seek to maintain a dopant concentration of ~$10^{17}$ dopant atoms per square centimeter in this retrograde layer. In conventional stochastically doped devices of this size, this doping concentration exhibits acceptable carrier mobility. ITRS specifications for sub-70 nm FET channel retrograde doping profiles

| ITRS Technology Node | Gate length (nm) | Drain extension (nm) | Drain extension lateral abruptness (nm/decade) | Retrograde channel depth (nm) | Number of atoms in retrograde channel |
|---|---|---|---|---|---|
| 80 nm | 45 | 13–23 | 3.5 | 13–19 | 10 |
| 65 nm | 35 | 10–17 | 2.8 | 10–15 | 4 |
| 32 nm | 18 | 5–9 | 1.4 | 5–7 | 1 |

BACKGROUND OF INVENTION

Conventional semiconductor doping is not a deterministic process, i.e. it creates a statistical distribution of dopants. In the case of field-effect devices, stochastic doping enables reliable device performance by ensuring a reproducible distribution of large numbers of dopant atoms in the channel region. However, conventional doping processes, such as traditional diffusion or implantation techniques, cannot be used to control the atomic scale positioning of dopant atoms. In conventional FET devices, the exact number of doping atoms in a given region is determined by chance, constrained by the requirements that the average doping over a large number of small regions must be the correct macroscopic average. As feature sizes are scaled to a few nanometers (nm), the traditional stochastic approach to doping is presenting problems.

Some of the reasons that conventional doping technology imposes limits on scaled sub-100 nm FET integrated circuits are related to the number and position of individual dopant atoms in the channel. First, consider the impact of dopant numbers in ultra-small FETs. At these small dimensions, reliable FETs require large channel doping densities to prevent the punch-through effect. However, large channel doping densities in such conventionally scaled FETs adversely decrease device performance, for example, due to multiple scattering that decreases channel mobility. Hence, conventional stochastic doping technology limits the feasibility of achieving concurrent improvements in the performance of scaled, ultra-small FETs.

Super steep retrograde doping technology offers some advantages over conventionally scaled devices. The channels of sub-70 nm FETs with super steep retrograde doping consist of a very thin surface layer, with a lower dopant concentration of $10^{17}$ cm$^{-3}$, that changes abruptly to an underlying heavily doped layer, with a dopant concentration of about $10^{19}$ cm$^{-3}$. The thickness of the lightly doped surface layer should be less than the source-drain extension depth. Based on the data in Table 1, derived from the 2001 International Technology Roadmap for Semiconductors Next, consider the impact of dopant number and position on the variability of small device performance characteristics. According to Table 1, as devices scale below the 80 nm ITRS node, the number of dopant atoms in the retrograde channel is less than ten. Such a small number of dopants in the thin surface layer cannot be obtained reproducibly using conventional doping techniques. The device parameters are therefore sensitive to statistical fluctuations (proportional to the square root of the number of dopants). At the 100 nanometer ITRS node, the operating regime is such that discrete dopant fluctuations lead to substantial variations in threshold voltage of about 20–50 mV. Below the 80 nm node the threshold voltage variation can be 25–100% of the operating voltage. Taking into account the uncertainty in dopant position, in addition to the uncertainty in the number of dopants, will make the parameter variability even worse. Uncertainty of the individual transistor's parameters in one chip imposes a practical limit to scaling, due to the difficulty of design, fabrication and operation of complex systems based on non-identical FETs. In complex ICs, the probability that all transistors are identical and that a circuit will function properly, within given specifications, sharply decreases with decreasing channel length. Therefore, new ways of doping must be developed if practical ultra-small field-effect devices are to be realized.

SUMMARY OF INVENTION

The present invention is directed to field-effect semiconductor devices and methods of making such devices where relatively small numbers of dopant atoms, also referred to as impurities or impurity atoms, are arranged in the channel in an engineered array or engineered arrays. An engineered array is defined as a configuration of one or more dopant atoms, where each atom is placed in a specific, predetermined location with respect to the channel and other dopant atom(s) in the channel. In this way, ultra-small devices with appropriate performance characteristics can be realized.

In one example embodiment a device structure includes a host structure with an undoped or low-doped channel region. An engineered array of impurities is disposed at the channel region of the host structure. The engineered array comprises at least one dopant or impurity atom. By "at the channel region" what is meant is that the engineered array can be placed atop, within, in or on the channel region of the host structure or implanted within the channel region, either completely or in part. This term is also intended to encompass the situation where a portion of the engineered array lies just within the source and the drain. The array can also be disposed on top of intervening layers and structures at a specified distance but still close enough to the channel region itself for desired operation. Component atoms of the engineered array are substantially fixed by substantially controlled placement in order to facilitate the necessary control of source-drain carrier flow. Carriers can be either electrons or holes. A source and drain region may be included in the original host structure or may be added by conventional methods after the engineered array is in place.

Depending on the specific embodiment, a field-effect transistor can be formed by including a first insulator disposed atop the host structure with channel, source, and drain regions, and the engineered array of impurities in the host structure and a gate disposed atop the first insulator. The device can also be made a silicon-on-insulator (SOI) device, in which case a second insulator is disposed beneath the field-effect device structure. The engineered array of impurities can include some or all component atoms arranged substantially in one or more rows running substantially parallel to the channel region source and drain interfaces, or at least one of the interfaces. Alternatively, the engineered array can include some or all component atoms arranged in a substantially ordered pattern resulting at least in part from self-assembly of the component atoms, or a combination of the two, or in other arrangements. Dopant atoms can be p-type, n-type or combinations of the two.

In one embodiment, a field-effect transistor like that described above is assembled by forming a host structure including a channel region. Dopant atoms are placed and formed into an engineered array at the channel region. An epitaxial film of semiconductor materials is grown over the structure. At this point, a dielectric layer can be formed over the epitaxial film and a pattern can be applied to the host structure to define the final shape of the field-effect transistor. Finally, a gate electrode can be formed atop the dielectric layer.

In another embodiment, such a transistor is formed by first forming a semiconductor substrate, and then placing a first atom of the engineered array of dopant atoms on the substrate. A first epitaxial film of depleted semiconductor material can then be grown over the first atom and the semiconductor substrate. A second atom of the engineered array of dopant atoms is then placed on the first epitaxial film, and a second epitaxial film is grown. Atoms and epitaxial films can then alternately be placed atop the structure until the engineered array of dopant atoms is formed beneath a final epitaxial film of depleted semiconductor material. A dielectric layer can then be applied, followed by patterning and the forming of a gate as before. Depending on the embodiment, atoms can be placed by proximity probe manipulation, ion implantation, or facilitating self-assembly of the atoms as necessary.

BRIEF DESCRIPTION OF DRAWINGS

FIG. 11 is presented as a top view of the device illustrated in FIG. 11A, and a cross-sectional view of the device illustrated as FIG. 11B.

FIG. 22 illustrates the fabrication process for a device according to some embodiments of the present invention.

FIG. 23 illustrates another fabrication process for a device according to additional embodiments of the present invention.

DETAILED DESCRIPTION

The present invention will now be described in terms of specific, example embodiments. It is to be understood that the invention is not limited to the example embodiments disclosed. It should also be understood that not every feature of the semiconductor devices described is necessary to implement the invention as claimed in any particular one of the appended claims. Various elements and features of various embodiments of devices and processes are described to fully enable the invention. It should also be understood that throughout this disclosure, where a process or method is shown or described, the steps of the method may be performed in any order or simultaneously, unless it is clear from the context that one step depends on another being performed first.

At least some of the drawings, which are used to illustrate the inventive concepts, are not mutually exclusive. Rather, each one has been tailored to illustrate a specific concept discussed. In some cases, the elements or steps shown in a particular drawing can co-exist with others shown in a different drawing, but only certain elements or steps are shown for clarity. For example, multiple types of dopants or multiple configurations of engineered arrays can co-exist in one device, or in multiple devices being fabricated together, or connected together in an integrated circuit.

It should also pointed out that references are made throughout this disclosure to figures and descriptions using terms such as atop, top, above, beneath, below, within, on, at, vertical, horizontal, etc. These terms are used merely for convenience and refer only to the relative position of features as shown from the perspective of the reader. An element that is placed or disposed atop another element in the context of this disclosure can be functionally in the same place in an actual product, but be beside or below the other element relative to an observer due to the orientation of the equipment. Any discussion using these terms is meant to encompass all such possibilities.

Figure 1:
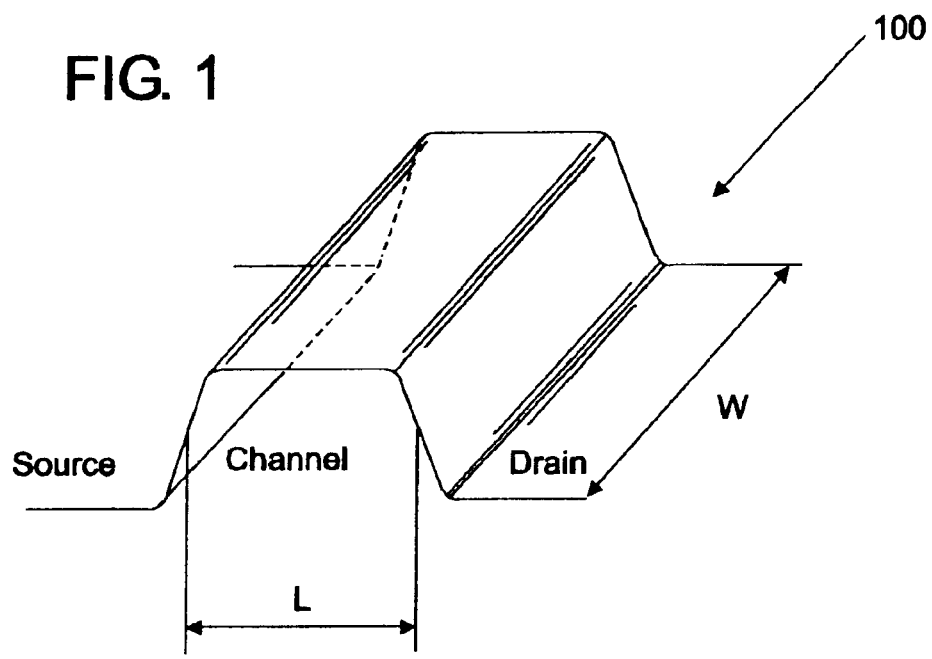
FIG. 1 is a schematic illustration of a two-dimensional energy diagram, which provides a key to some dimensions and device regions discussed herein with respect to specific embodiments of the invention.

FIG. 1 schematically illustrates the two-dimensional potential diagram 100 for field-effect device structure like that which will be discussed here. The channel represents a potential energy barrier to carrier flow. As can be seen, the term "channel length" as used herein refers to the distance across the channel between source and drain, and is indicated with the letter L. The "channel width" is the distance across the device structure over which the source region, drain region, and channel region are parallel, and is indicated with the letter W.

Figure 2A:
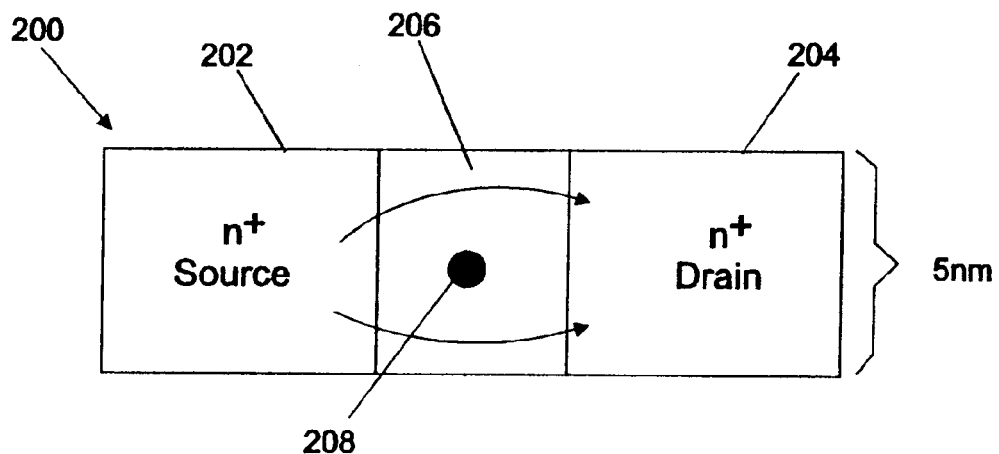
FIG. 2 shows two views of a field-effect device having a single atom disposed in a depleted channel. A top view is shown in FIG. 2A and a cross-sectional view is shown in FIG. 2B.

As previously described, the invention contemplates the use of an engineered array of dopant atoms in the channel region of an FET device, including the use of a single dopant atom. However, it should be noted that the terminology an "engineered array of impurities" or of "dopant atoms" encompasses any devices in which the engineered array includes one or more atoms where positions of each atom are controlled in order to achieve consistent performance in ultra-small devices. Engineered arrays according to embodiments of the invention include but are not limited to single atoms, non-repeating or repeating linear and non-linear patterns, geometric shapes such as circles, spirals, triangles, or squares, and other patterns that appear irregular but can be specified numerical terms. The engineered positioning of one or more dopant atoms in a depleted channel creates a barrier(s), well(s), or a combination of barriers and wells across the channel to engineer channel characteristics. FIG. 2 illustrates an example of one possible a device. FIG. 2A is a top down, "see-through" view of a device, 200, including source region 202, drain region 204, and depleted channel region 206. A single dopant atom, 208, has been placed in the horizontal center of the channel region. This is a p-type dopant and the source and drain regions are $n^+$ material, as shown in the drawing. Throughout this disclosure, p-type dopants are illustrated as solid dots, and n-type dopants are illustrated as open circles. With an embodiment such as that illustrated in FIG. 2, the single dopant atom in the channel of a field-effect transistor (FET) will produce a very localized energy barrier.

Figure 3:
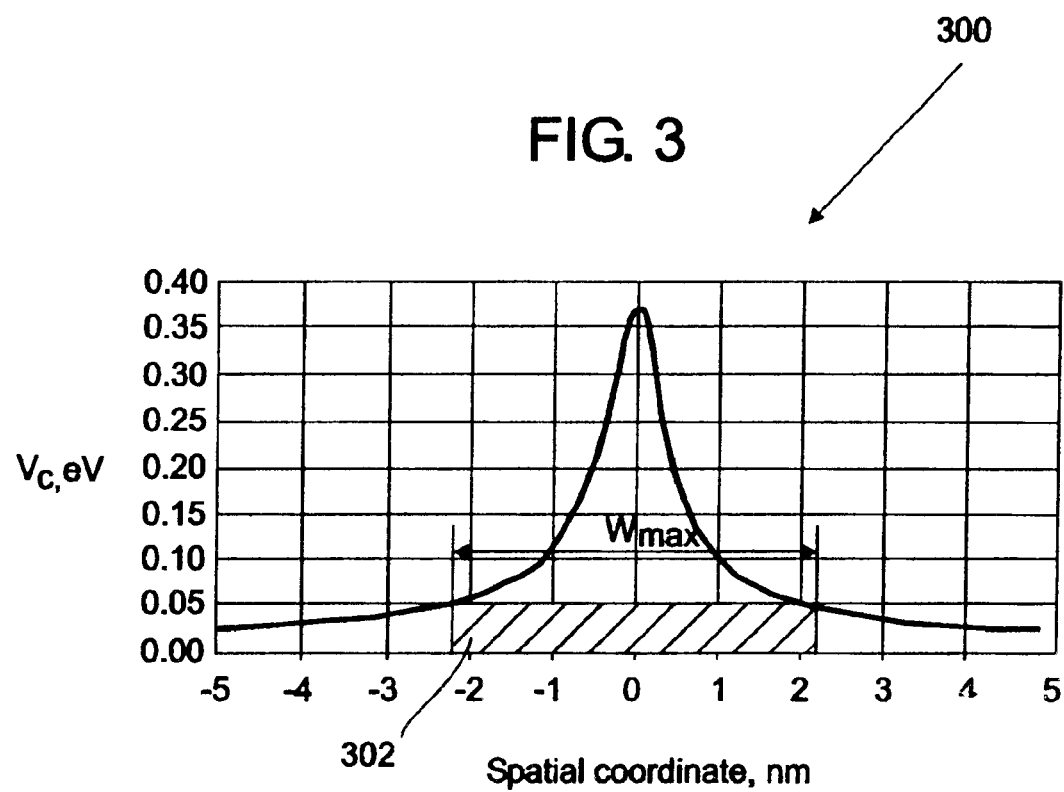
FIG. 3 illustrates the spatial distribution of a Coulomb potential, $V_c$, in an FET channel created by a single acceptor atom. The cross-hatched rectangle indicates a barrier region.

FIG. 3 is a graph, 300, showing how a potential barrier, created by one acceptor in the middle of a silicon (Si) channel, decreases with increased distance from the center. For this example, derived from the condition that:

$$\frac{I_{on}}{I_{off}} \geq 10$$

the maximum channel width is given by:

$$W_{max} \approx \frac{e}{(4\pi\varepsilon_0 \varepsilon k_B T)} \approx 5 \text{ nm}$$

where e=$1.6 \times 10^{-19}$ C, $\square_o$=$8.85 \times 10^{-14}$ F/cm, and $\square$=12, for Si. The spatial distribution of a Coulomb potential, $V_c$ is shown in eV in an FET channel created by a single acceptor atom. Cross-hatched area 302 indicates the barrier region. Thus, if the channel width is too great, the barrier provided by the dopant atoms will be insufficient and electrons will cross the channel by going around the dopant, as illustrated by the bold arrows in FIG. 2A. Thus, the channel width must be kept relatively narrow, so that it is comparable to the spatial dimensions of the single-dopant barrier. A practical device with a single-dopant engineered array can be made under these example conditions if it has a channel width of less than approximately 5 nm.

Figure 2B:
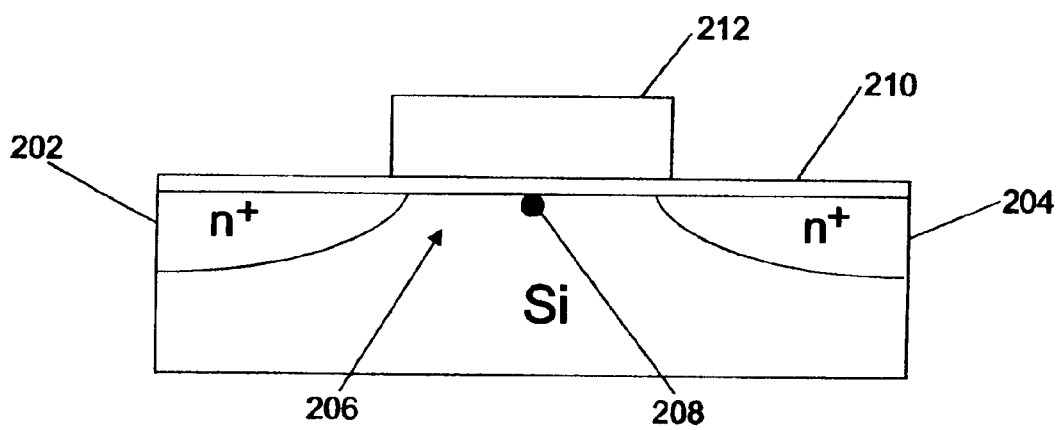

FIG. 2B illustrates the same device as in FIG. 2A, only in this case a cross-sectional view is shown. It can also be seen in FIG. 2B that in the finished device a metal oxide insulating layer, 210, and gate 212 are present. The device is a silicon device thus, it can be referred to as a silicon based field-effect transistor (FET).

Figure 4:
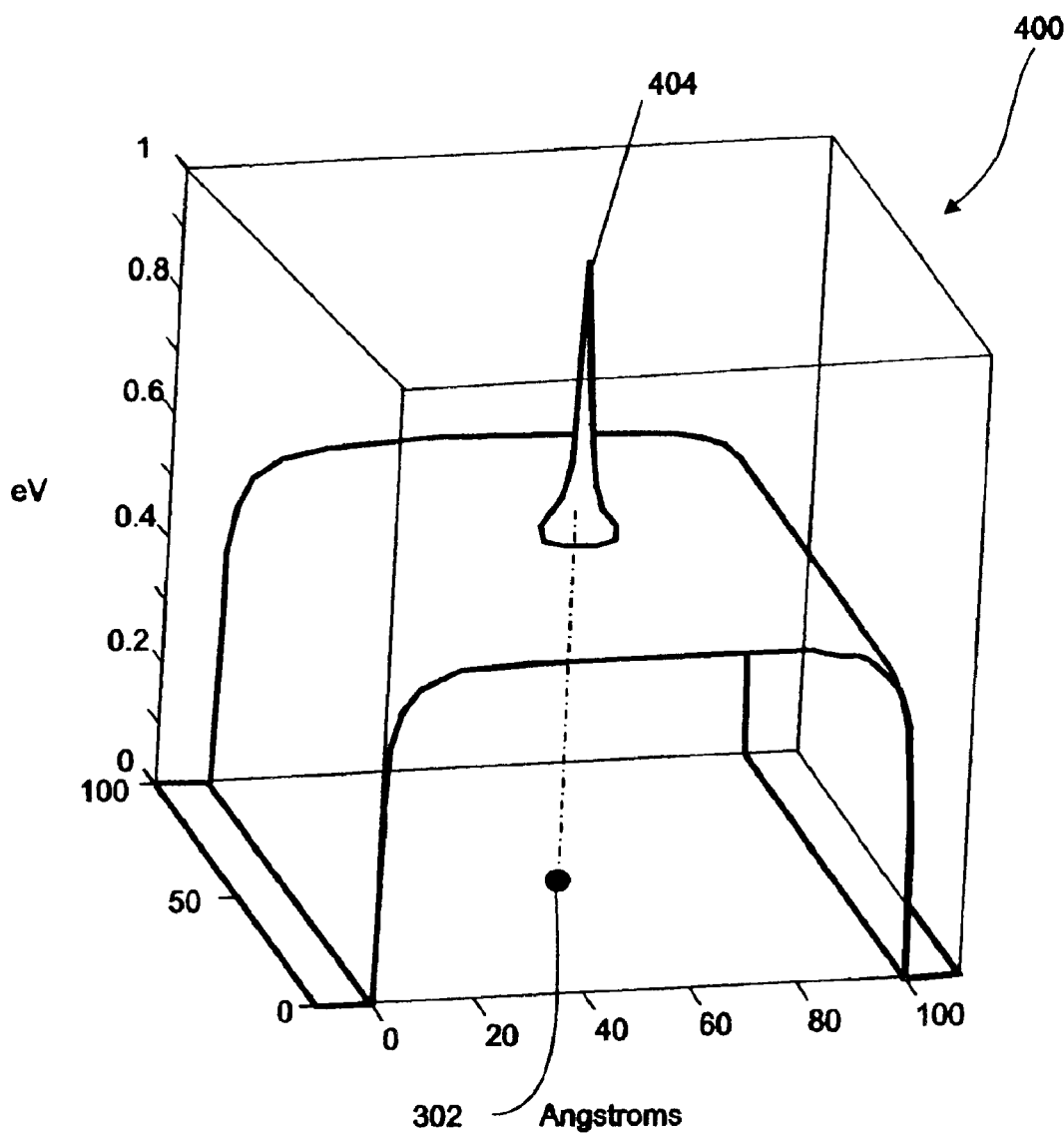
FIG. 4 is a two-dimensional potential energy graph of the device, cross-section parallel to the gate, illustrated in FIG. 2
Figure 6:
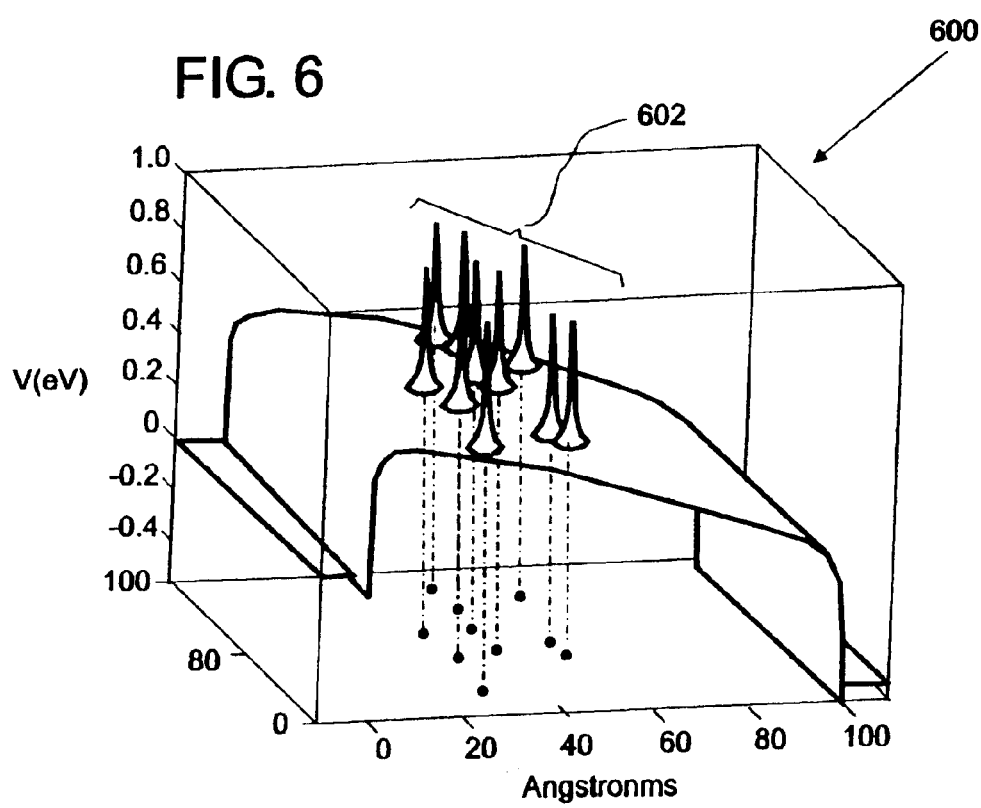
FIG. 6 is a two-dimensional potential energy graph for the device, cross section parallel to the gate, illustrated in FIG. 5.

FIG. 4 is a two-dimensional potential energy graph, 400, for a single atom in or on depleted semiconductor material. The graph shows potential energy in eV plotted against position in angstroms in two dimensions. The position of the atom is shown at 402. The atom produces a potential energy peak at 404.

It will be helpful to the reader to understand the effects of having a small number of atoms randomly distributed in the channel of an ultra-small device. These effects are illustrated in FIGS. 5–9. This discussion is being presented in order to aid in the comprehension of the later discussion of the nature and construction of the engineered arrays according to the invention in the cases where an engineered array includes more than one impurity atom.

Figure 5:
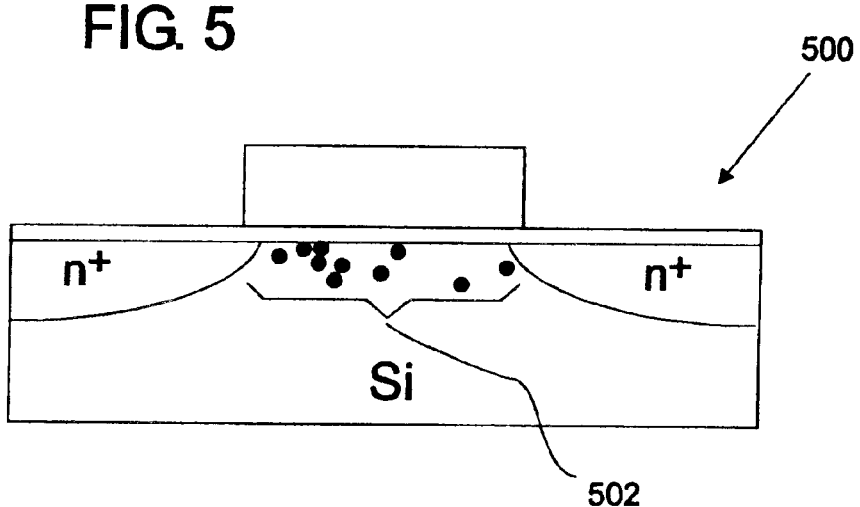
FIG. 5 is a cross-sectional view of a field-effect device with a small number of atoms arranged randomly in a depleted channel region.

FIG. 5 is a cross-sectional view of an ultra-small silicon device, 500 with multiple p-type dopants, 502, randomly distributed in at the depleted channel region. Other elements of this device are the same as in the device previously illustrated with a cross-sectional view, and thus reference numbers for these elements are omitted for clarity. By making a large number of devices at once with small numbers of randomly distributed dopant atoms, a small number of the devices may have an appropriate distribution of dopant atoms to function. But, as the channel length approaches 10 nm, the isolated effects of each of small numbers of dopant atoms in the channel will increasingly determine and dominate device properties. As shown in potential energy graph 600 of FIG. 6, at these device dimensions, the dopant atoms create a few isolated potential barrier "islands" as illustrated at 602, and not the continuous potential barrier, expected from conventional FETs. The positions of these localized potential barriers will affect the trajectories of electron movement in the channel, resulting in different current-voltage characteristics for each working device.

Figure 8:
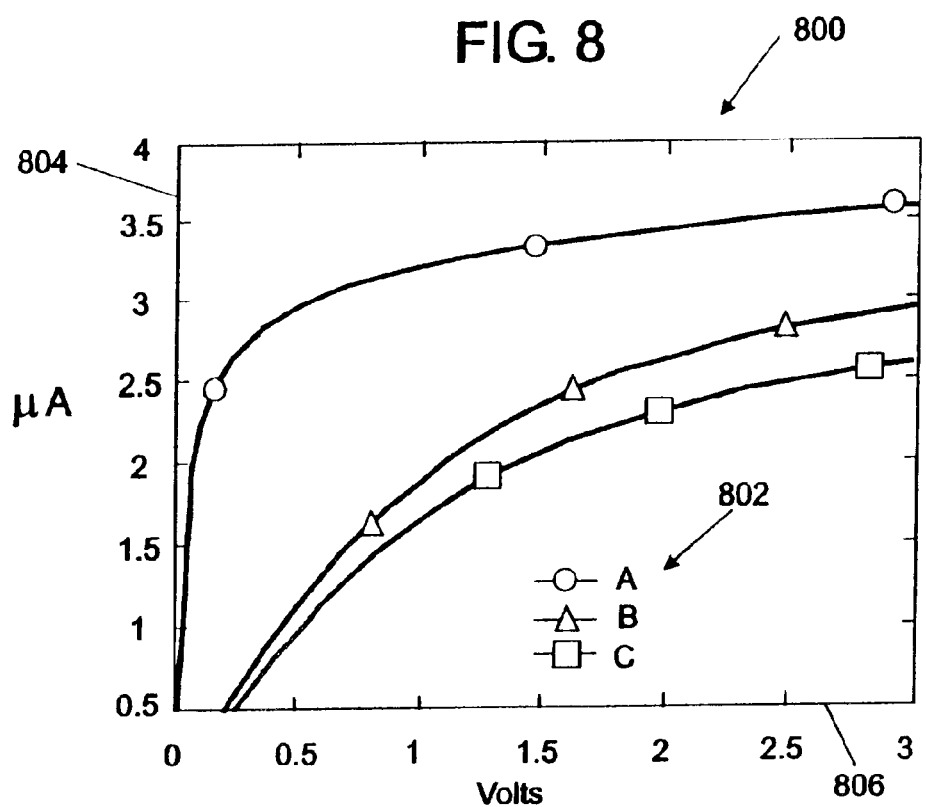
FIG. 8 is a graph showing the comparative voltage vs. current characteristics of devices like that illustrated in FIG. 7.
Figure 7B:
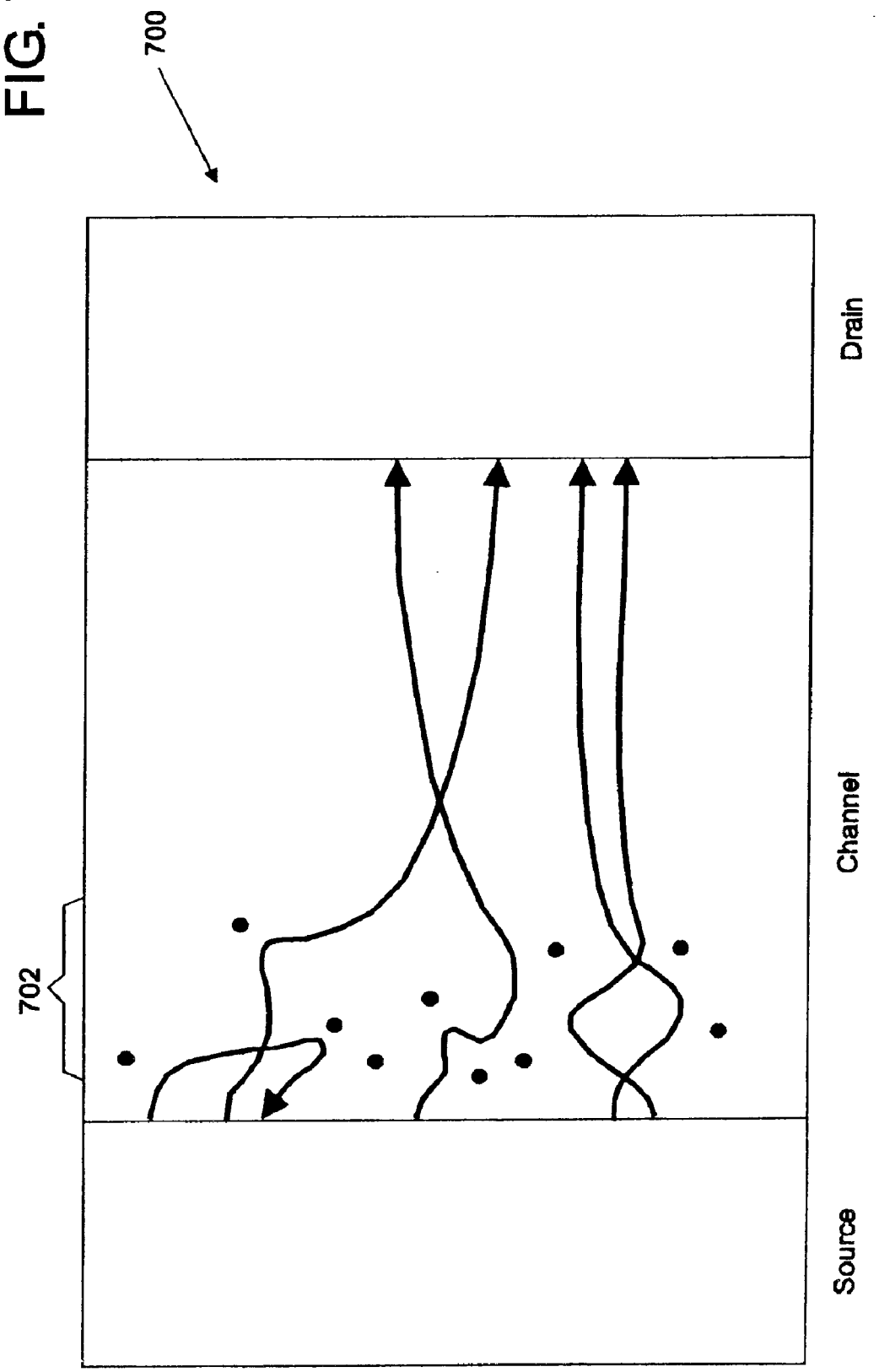
FIG. 7 is shows three top views of a device like that illustrated in FIG. 5, each view showing a different, random arrangement of dopant atoms. The views are labeled FIG. 7A, FIG. 7B, and FIG. 7C for convenience.

FIGS. 7 and 8 illustrate these variations. FIGS. 7A, 7B, and 7C each show a top-down, see-though view of a device from a collection of devices which had small number of impurity atoms randomly distributed at the channel region. The source region, drain region, and channel region of each device are indicated. FIG. 7A illustrates device 500 with dopant atoms 502 from FIG. 5. FIG. 7B shows device 700 with dopant atoms 702 having a different, but random distribution. FIG. 7C shows device 750 with dopant atoms 752 in yet still another different, but random distribution. The bold arrows traversing the channel in the devices shown in FIG. 7 are example carrier trajectories. FIG. 8 is a current-voltage graph, 800, with curves showing the current-voltage characteristics for each device, as indicated by the included legend, 802. Axis 804 is plotted in micro-Amps and axis 806 is plotted in Volts. The graph shows a variation in characteristics that would be unacceptable for devices in many cases. Note that the plots correspond to different distributions of the same number of dopant atoms. Thus, merely controlling the number of atoms at small sizes cannot achieve results that are completely acceptable.

Figure 9:
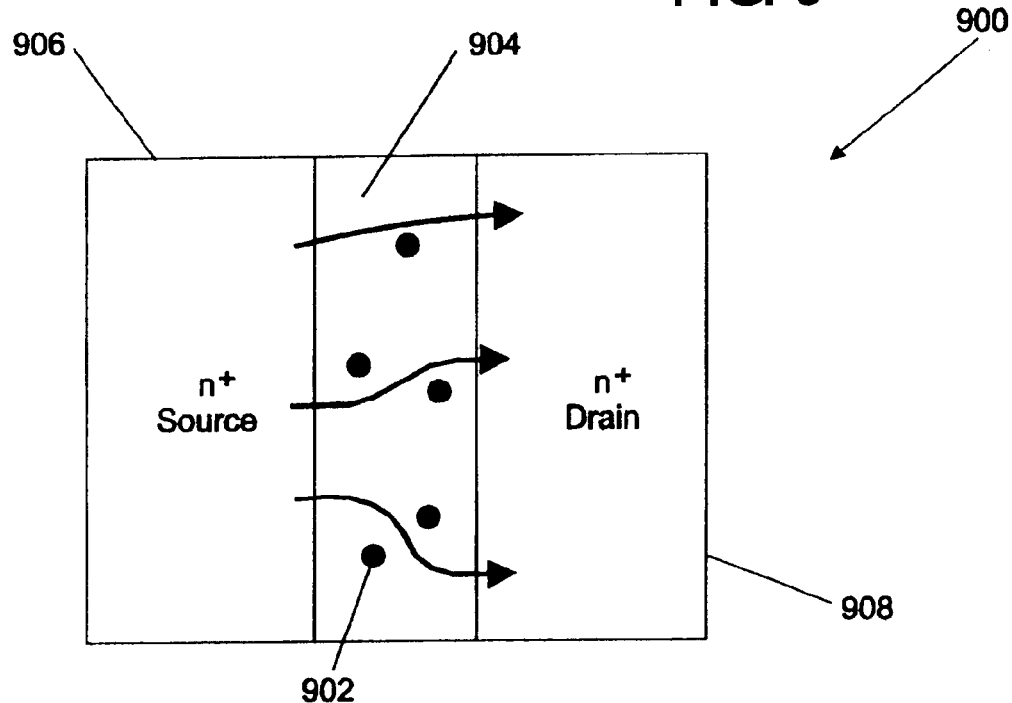
FIG. 9 is another top view of a device with a small number of randomly arranged dopant atoms in a depleted channel region.

For stochastically doped devices, a carrier interacts with several impurities at any given instant in time, thereby reducing channel mobility. The conventional stochastic doping with large numbers of dopant atoms results in multiple-electron scattering, which drastically decreases the carrier mobility. Hence, individual devices may not function according to the design specification due to the loose positional tolerances associated with stochastic doping. The results above illustrate that even with small numbers of atoms, a random distribution increases variability in carrier trajectories. This variability in trajectory lengths will induce variability in carrier transit times, with an adverse impact on device performance and device characteristics. These principles are illustrated in FIG. 9, which is a simplified, top-down, see-though view of a device, 900, with a random distribution of impurities 902 in channel region 904. The bold arrows in FIG. 9 running from source 906 to drain 908 show a sample of electron trajectories. For each different distribution of dopants in the channel, these trajectories are different.

Figure 10:
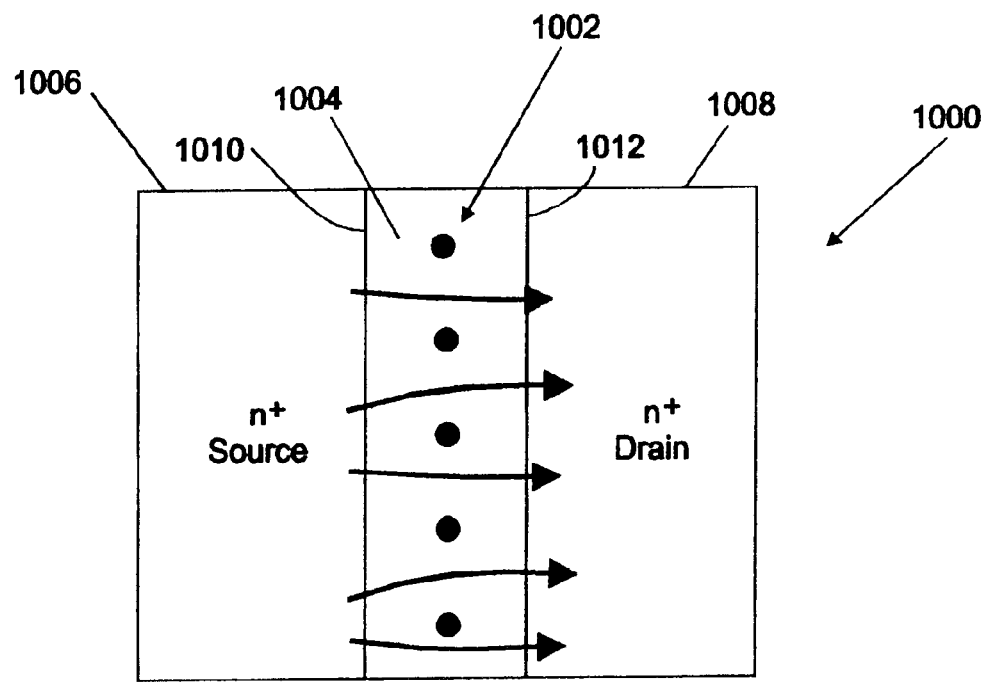
FIG. 10 is a top view of a device according to one example embodiment of the invention, having an engineered array of dopant atoms in the channel region.

To achieve improved, more consistent characteristics, according to embodiments of the invention, a small number of atoms is positioned in a controlled manner to form an engineered array at, in, or near a depleted channel region. In this way, controlled positioning of individual impurities can be used to create an optimal engineered energy barrier in a relatively wide-channel device as shown in FIG. 10. This periodic doping of FET channel boosts the mobility of charge carriers in the device and, as a result, improves consistency of current-voltage characteristics across devices and increases the operating frequency. In this example, device 1000 of FIG. 10 includes an ordered p-type dopant array, 1002, disposed at depleted channel region 1004. As is typical, the device structure also includes source region 1006 and drain region 1008, both of which are $n^+$ semiconductor. Using such a periodic array of dopant atoms, comprising at least one row running substantially parallel to the depleted channel region interfaces with the source and the drain, 1010 and 1012, respectively, effective control of the source-drain electron flow and minimum electron-impurity interactions are achieved. Note that by use of the term "substantially parallel" there is an intent to encompass variations within the tolerances discussed herein, and situations in which the interfaces themselves are not precisely parallel. Carrier trajectories (electrons in the case of p-type dopants) in this example embodiment will be as shown by the bold arrows, and will be substantially the same for each device that uses the same ordered dopant array. The placement tolerances of the dopant atoms will be determined by placement variances that still allow carriers to transit the channel with minimal scattering, i.e. electron-impurity interactions. In a typical silicon device like that shown in FIG. 10, placement tolerances of approximately 1 nm will suffice either for a regular array of dopant atoms, or other customized array patterns. Note that in some embodiments, additional substantially parallel rows of impurities can be included.

Atomic scale position control of dopant atoms can be used to create the engineered array shown in FIG. 10. Such positioning can be obtained using proximity probe manipulation techniques and devices can be fabricated using these techniques in combination with other more traditional techniques as will be described later with respect to FIGS. 20 and 21. Techniques to position atoms with the accuracy needed are known in the art. For example, a method of making an atomic chain circuit by placing atoms at predetermined locations is described in U.S. Pat. No. 5,981,316, issued Nov. 9, 1999, which is incorporated herein by reference. That method is based on atom manipulation technology that allows a fabricator to move atoms one by one and arrange them as desired using a proximity probe manipulation (PPM) technique.

Figure 11A:
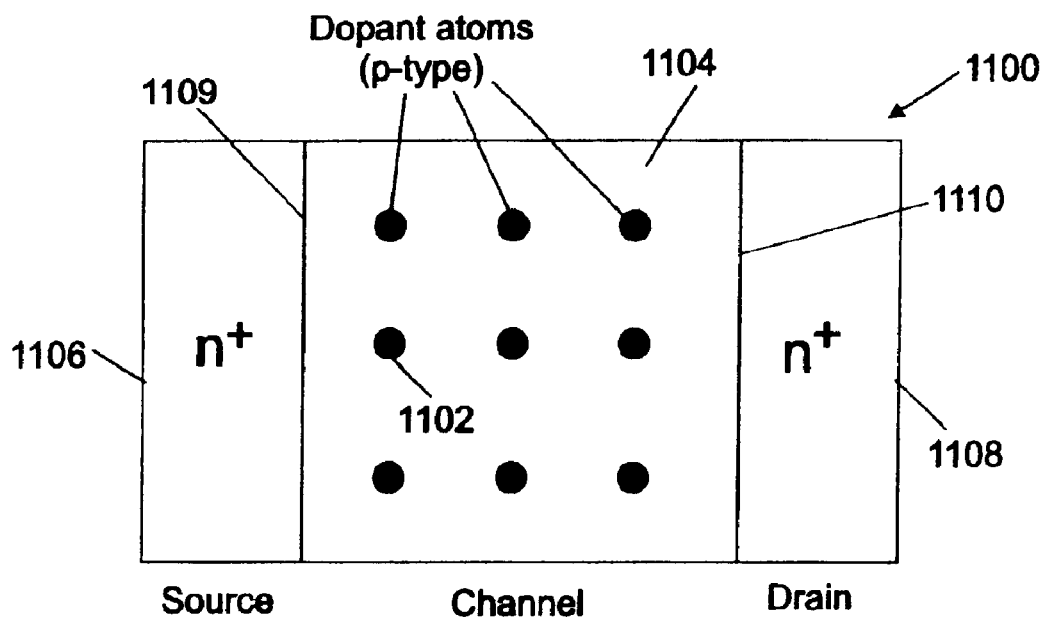
FIG. 11 illustrates another device according to another example embodiment of the invention.
Figure 11B:
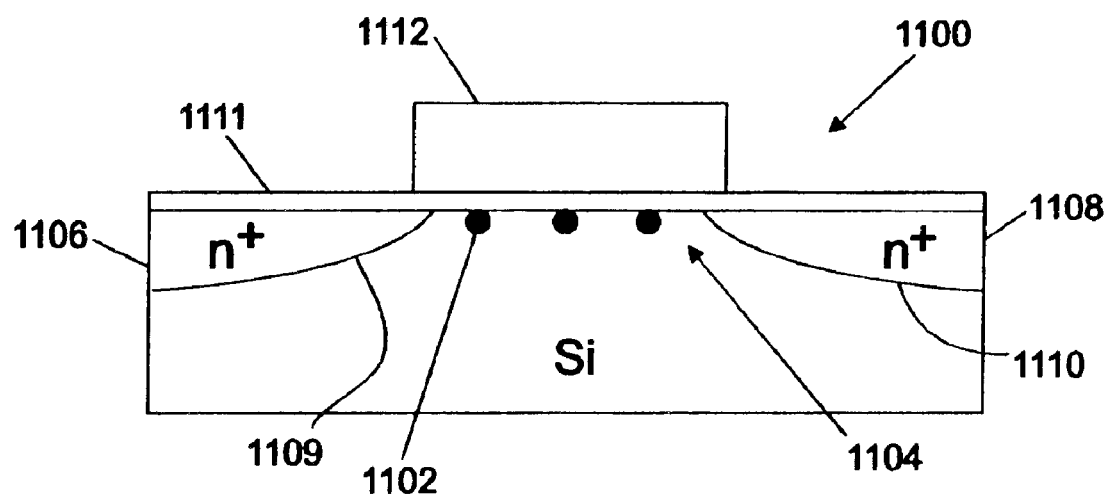

FIG. 11 shows two views of a field-effect device having an engineered array made up of multiple substantially parallel rows of component atoms. FIG. 11A presents a see-through top view and FIG. 11B presents a cross-sectional view. In this case device 1100 includes p-type dopant atoms 1102 in depleted channel 1104. Source 1106 and drain 1108 are $n^+$ material, and have interfaces with the channel at 1109 and 1110, respectively. In the cross-sectional view of FIG. 11B, dielectric layer 1111 and gate 1112 are visible.

It should be noted that, beyond parameter variations, another limitation of doped semiconductor $p^+$-n-$p^+$ or $n^+$-p-$n^+$ FET structures arises from the need to decrease the power supply voltage in order to decrease the total power consumption of an integrated circuit. Consider the operating voltage of a FET, which is determined by the source-channel barrier height $$\Phi_{s\text{-}Ch}$$

given by:

$$\Phi_{s-Ch} = \frac{E_g}{2} + V_c(N, x)$$

where $V_c(N,x)$ is the Coulomb contribution to the barrier, due to ionized dopants in the channel. The smallest barrier height is $E_g/2$ when the channel is completely undoped. For silicon devices $E_g=1.12$ eV. Thus, the implied fundamental limit for the minimum operating voltage of an undoped silicon FET is 0.56 V, for $n^+$-p-$n^+$ or$p^+$-n-$p^+$ or undoped systems.

The precise positioning of dopant atoms in a semiconductor channel enables structures that offer FET functionality below this perceived 0.56 V barrier. For example, adding engineered arrays of dopant atoms, of the same type as in the source and drain regions (e.g. forming $n^+$-n-$n^+$ or $p^+$-p-$p^+$ structures rather than $n^+$-p-$n^+$ or $p^+$-n-$p^+$ structures), enables devices structures with effective channel barrier heights less than $E_g/2$ (e.g. <0.56 eV for Si). Additionally, deterministically controlled channel doping, of the same type as the source and drain regions, allows for an extension of the FET concept by including doped resonant tunnel transistors, DRTT, based on $n^+$-$n^-$-$n^+$ or $p^+$-$p^-$-$p^+$ structures. In this case, dopants in the channel form localized potential wells, not broad potential barriers. For the case of a single dopant atom in the channel, if the distances between the source, drain, and well (the dopant atom) are approximately 5–10 nm, to enable tunneling, the controlled electron flow from source to drain can proceed by resonant tunneling through this potential well. For the case of more than one dopant atom, resonant tunneling through channels longer than 5–10 nm can be achieved via a string of dopants to create an overlapping system of potential wells. In this case, interdopant distances also must be less than approximately 5–10 nm.

The positioning of dopant atoms also may be used to improve the uniformity of the source to channel and the channel to drain interfaces. Additionally, either donor or acceptor atoms (p-type or n-type impurities) can be used to form an engineered array according to embodiments of the invention. In the case of n-type impurities, potential wells are formed in the material instead of potential barriers. It is also possible to precisely position both donor and acceptor atoms in a channel, thus forming both potential barriers and wells at specified positions. In such structures, more diverse carrier trajectories and device functionality may be achieved. Using device notation specifying source and drain types, and dopant types by carrier, devices in which a single type of dopant forms the engineered array in the channel can include $n^+$-p-$n^+$, $p^+$-n-$p^+$, $n^+$-n-$n^+$, and $p^+$-p-$p^+$. However, as will be shown in examples below, a device can be made with both dopant types in the engineered array, creating both wells and barriers. Such a device is represented with notations such as:

$$n^+ - \left\{ \begin{array}{c} n \\ p \end{array} \right\} - n^+$$

and $$p^+ - \left\{ \begin{array}{c} n \\ p \end{array} \right\} - p^+$$

Figure 12:
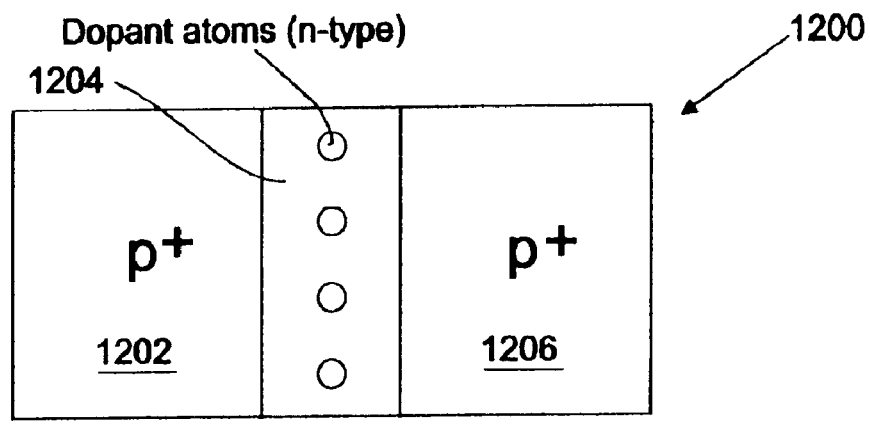
FIG. 12 is a top view of a device according to another example embodiment of the invention, again having an engineered array of dopant atoms in the channel region.
Figure 13:
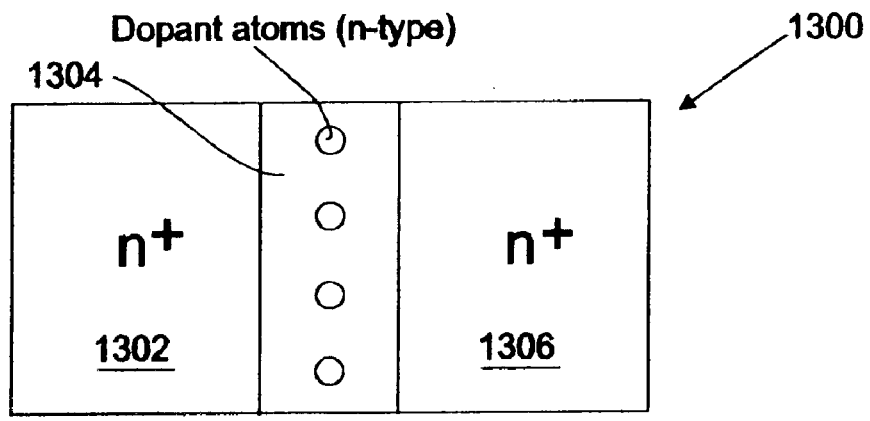
FIG. 13 is a top view of a device according to another example embodiment of the invention, again, having an engineered array of dopant atoms in the channel region.
Figure 14:
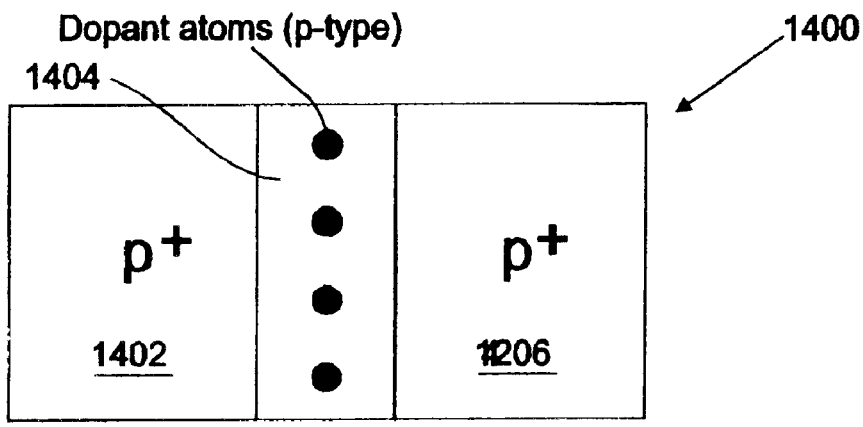
FIG. 14 is a top view of a device according to another example embodiment of the invention, again, having an engineered array of dopant atoms in the channel region.

FIGS. 12–14 show top-down views of field-effect device structures with additional configurations of p-type and n-type source and drain materials and impurities. In these examples, the engineered array is a row running substantially parallel to the source and drain interfaces with the depleted channel region. Note that other patterns of either repeating or non-repeating atoms can be used to make of an engineered array according to the invention, even patterns in which the array is not parallel to any of the interfaces or not periodic or linear in nature. The periodic rows of dopant atoms discussed herein are given as examples only. FIG. 12 illustrates a device 1200 with a $p^+$-n-$p^+$ configuration having source 1202, channel 1204, and drain 1206. FIG. 13 illustrates a device 1300 with an $n^+$-n-$n^+$ configuration having source 1302, channel 1304, and drain 1306. FIG. 14 illustrates a device 1400 with a $p^+$-p-$p^+$ configuration having source 1402, channel 1404 and drain 1406. Note that all of the examples discussed herein that include a row or multiple substantially parallel rows, the terms "row" and "parallel" and any similar terms are meant only to constrain geometries within achievable tolerances that allow device function as described herein. While at least some practical devices will use configurations of linear fragments, other engineered configurations also are within the scope of the present invention. Examples of other engineered configurations that may enable different devices and different device performance characteristics include, but are not limited to, circles, spirals, complex figures, etc. Also note that an engineered array may contain some organized arrangement of at least some component atoms, as well as other component atoms that are not part of the arrangement. The same holds true for other clusters or engineered arrangements of atoms mentioned in that the engineered array may include additional impurities besides those that make up these arrangements.

Figure 15:
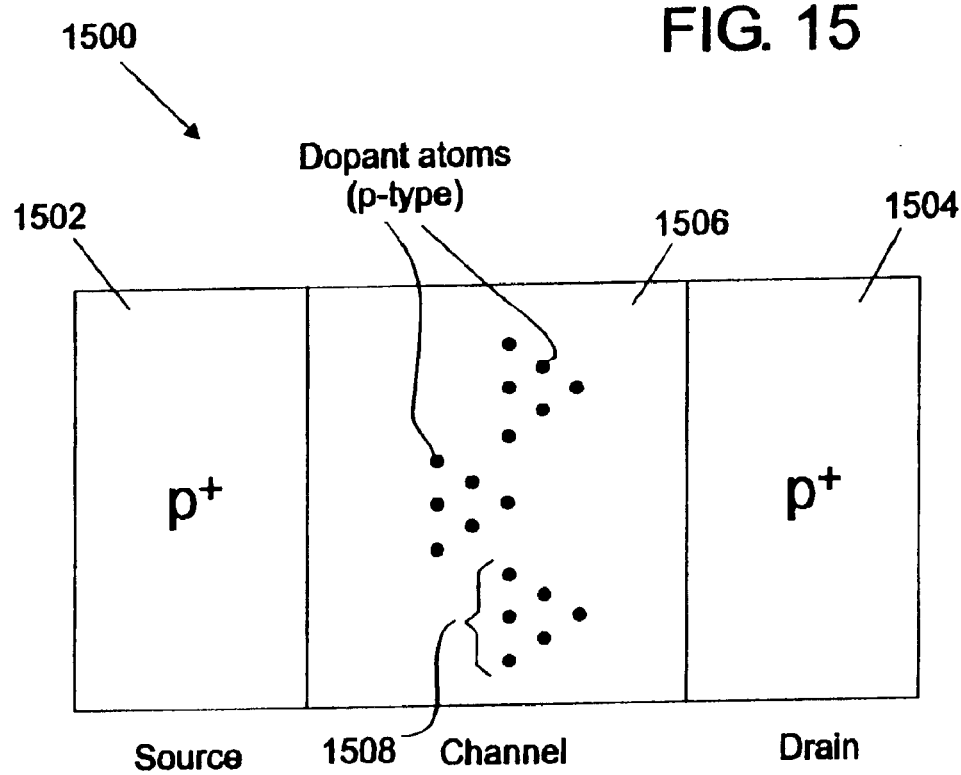
FIG. 15 is a top view of a device according to yet another example embodiment of the present invention.

In addition to placing atoms with proximity probe technology, other techniques can be used. These techniques include, for example, single ion and low energy manipulation, ion implantation methods, and self, surface assisted, and/or directed assembly methods. It has been shown that certain types of atoms will self-assemble into geometric or other ordered patterns on appropriately prepared surfaces of certain materials. As a specific example, it has been shown that aluminum atoms, which are p-type dopants in silicon, can be made to self-assemble into ordered clusters of 6 atoms in each cluster on a silicon surface if an appropriate temperature, in one experiment, 575° C., is maintained. See Kotlyar et al., *Physical Review B*, 66 (2002) 165401, which is incorporated herein by reference. FIG. 14 shows a see-through top view of a device in which an engineered array of aluminum atoms (a p-type dopant) has been formed into an ordered pattern (in this specific example, a triangular pattern) by facilitating self-assembly as described above. FIG. 15 shows a $p^+$-p-$p^+$ device 1500 with source 1502, drain 1504, and channel 1506. The engineered array of dopants is made up of three triangular groups, 1508 of six aluminum atoms each. Groups of dopants in this type of device can be many shapes, depending on the specific type of process used for self-assembly, including non-linear and non-geometric patterns, as well as other ordered patterns such as squares, diamonds, lines, etc. Devices can be made using self-assembly with any combination of n or p carrier types and source/drain types.

Figure 16:
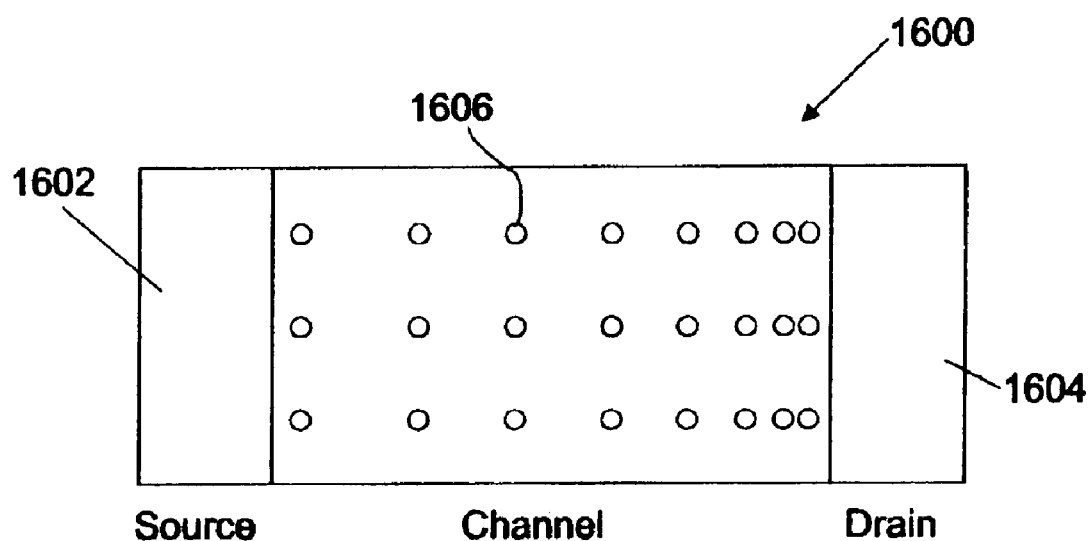
FIG. 16 is a top view of a device according to another example embodiment of the invention, having an engineered array of dopant atoms in another example pattern in the channel region.
Figure 17:
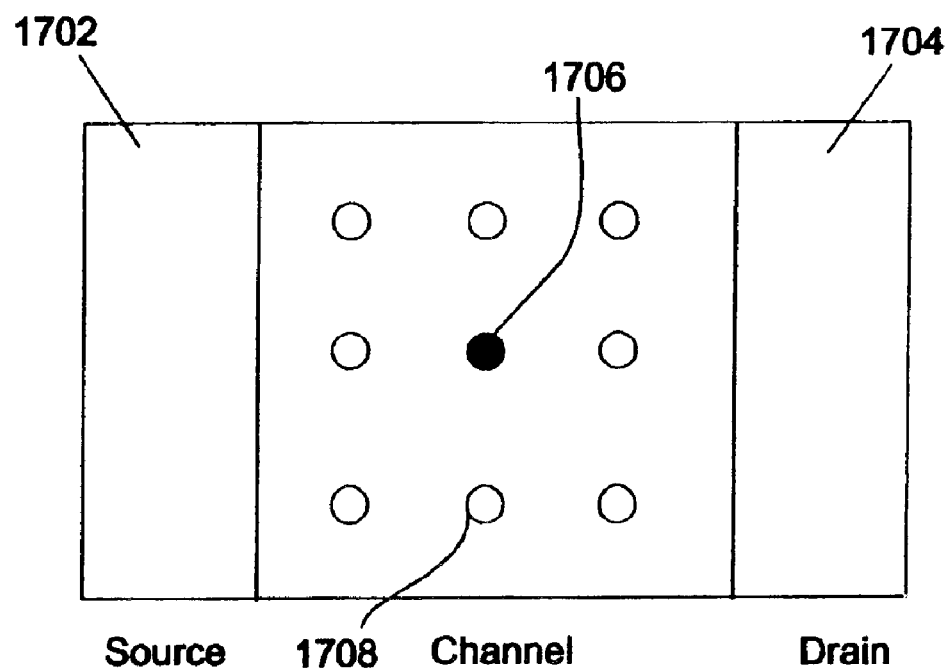
FIG. 17 is a top view of a device according to another example embodiment of the invention, having an engineered array of both types of carrier atoms in the channel region.

FIG. 16 illustrates a top-down view of a device, 1600, in which the engineered array of p-type dopant atoms is arranged in an irregular pattern of substantially parallel rows. In this case, source 1602 and drain 1604 can be either p or n type structures. The engineered array in this specific example includes 24 p-type impurity atoms such as atom 1606. FIG. 17 illustrates an example device, 1700, with both types of dopants in the engineered array. Again, source 1702 and drain 1704 can be n-type or p-type material. The channel in this embodiment has an engineered array that includes n-type impurity atom 1706, and eight p-type impurity atoms such as atom 1708.

Figure 18:
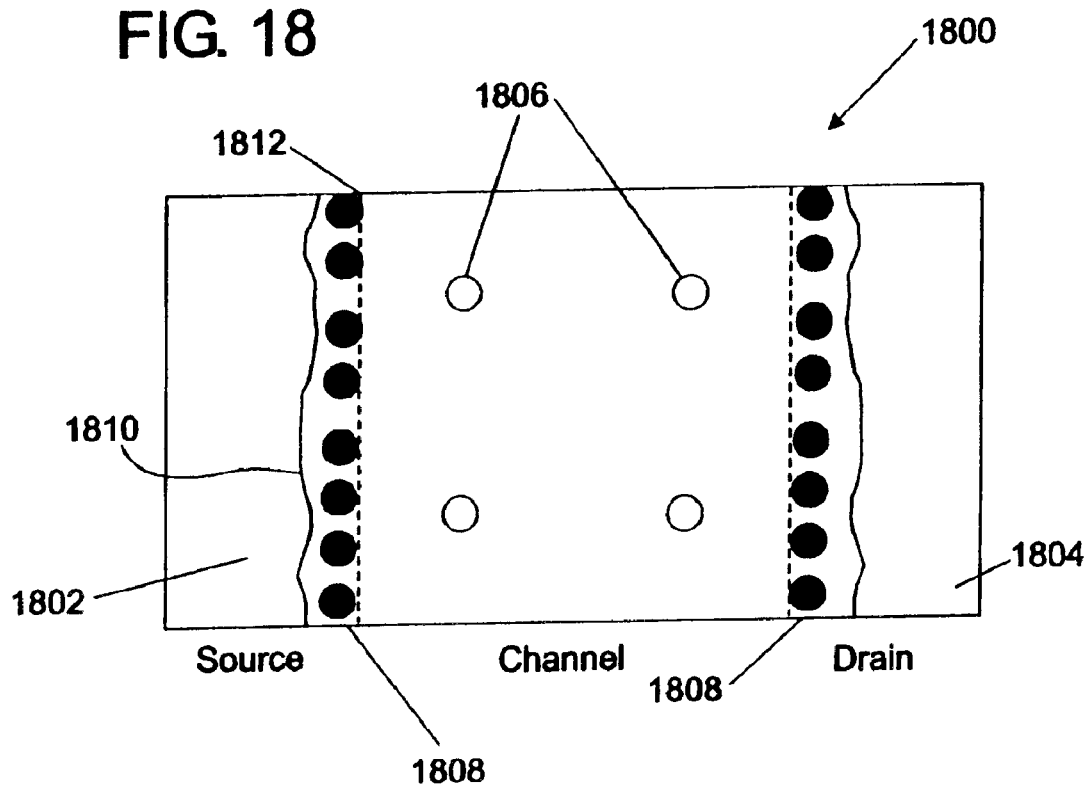
FIG. 18 is another top view of a device according to another example embodiment of the invention in which some dopant atoms are used to improve the uniformity of the source-channel and drain-channel interfaces.

FIG. 18 is another example device, 1800, which includes an engineered array of both types of dopant atoms. In this particular example, one type of dopant is used to facilitate an improvement of the uniformity of the source-channel and drain-channel interfaces. Device 1800 includes n-type source and drain regions 1802 and 1804, respectively. As previously described, these regions can be created by traditional diffusion or similar methods. The engineered array in this example includes p-type dopant impurity atoms such as shown at 1806. These atoms are placed in a relatively central location in the channel. The engineered array also includes n-type dopants 1808. Note that the originally diffused source and drain regions included irregular interfaces such as that shown at 1810. Atoms 1808 of the engineered array are the same type as that used to make the source and drain, and are positioned substantially along the original interfaces 1810. Thus the source and drain are extended slightly, and new, more uniform source-channel and drain-channel interfaces are created such as that shown at 1812. Note that, as before, any of various combinations of p and n type dopants and source and drain materials can be used in created a device such as that shown in the example of FIG. 18.

Many manufacturing methods can be used to make single or engineered array deterministically doped cells and FET devices according to the invention. One example procedure can be summarized as follows. A depleted host structure is first defined. This host structure can be fabricated with conventional, known, manufacturing methods. Next, dopant atoms are deterministically positioned in the channel region. The dopant atoms can consist of donor, or acceptor, or donor and acceptor types. Finally, device fabrication is completed using known fabrication techniques that create a standard gate structure over the channel region, with activated dopants. The dopant atoms can remain on or even above the channel surface or be placed under the surface, via standard deposition techniques.

Figure 19:
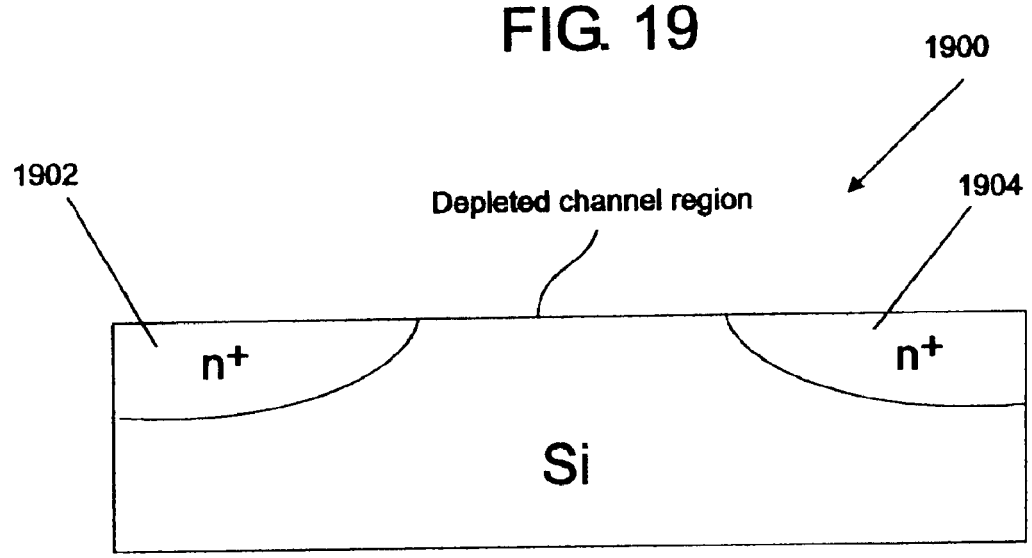
FIG. 19 illustrates a depleted channel host structure that can be used to make devices according to some embodiments of the invention.

In the first step, the size and shape of individual depleted host cell structures are constructed and defined with fabrication methods, known to those skilled in the art. These methods can involve known submicron and nanoscale patterning, etch, deposition, and ion implantation techniques. These methods for fabricating host cell regions include, but are not limited to: lithography, both conventional and so-called "next generation lithography" (NGL); maskless patterning; imprint or "step and flash" patterning; self or directed assembly; and thin film or interface deposition by chemical vapor deposition (CVD), molecular beam epitaxy (MBE) or atomic layer epitaxy (ALE). A cross-sectional schematic of a host cell structure is shown at 1900 of FIG. 19. This host structure is silicon-based and includes $n^+$ source region 1902 and $n^+$ drain region 1904.

Alternatively, individual depleted host cell structures could be patterned from undoped or low-doped Silicon-on-insulator (SOI) substrates, with doping concentration less than $10^{14}$ cm$^{-3}$. A schematic of a simple SOI based, host cell structure is shown at 2000 of FIG. 20. This host structure is silicon-based and includes $n^+$ source region 2002 and $n^+$ drain region 2004. The probability that small cells, patterned with dimensions below 100 nm, will contain at least one bulk dopant atom will be less than 10%. For the purposes of small-scale production, testing the resistivity of these patterned cells identifies a set of cells that can be used for preparing deterministically doped FET devices.

It should be noted that a host structure into or onto which an engineered array is added according to embodiments of the invention may or may not already have a source and drain region. The source and drain region can be created by diffusion or another method prior to building an engineered array according to the invention, or the engineered array can be placed in what is or will be the channel region of the device before the source and drain are created. In this case, the source and drain will be formed with the engineered array in place.

Figure 20:
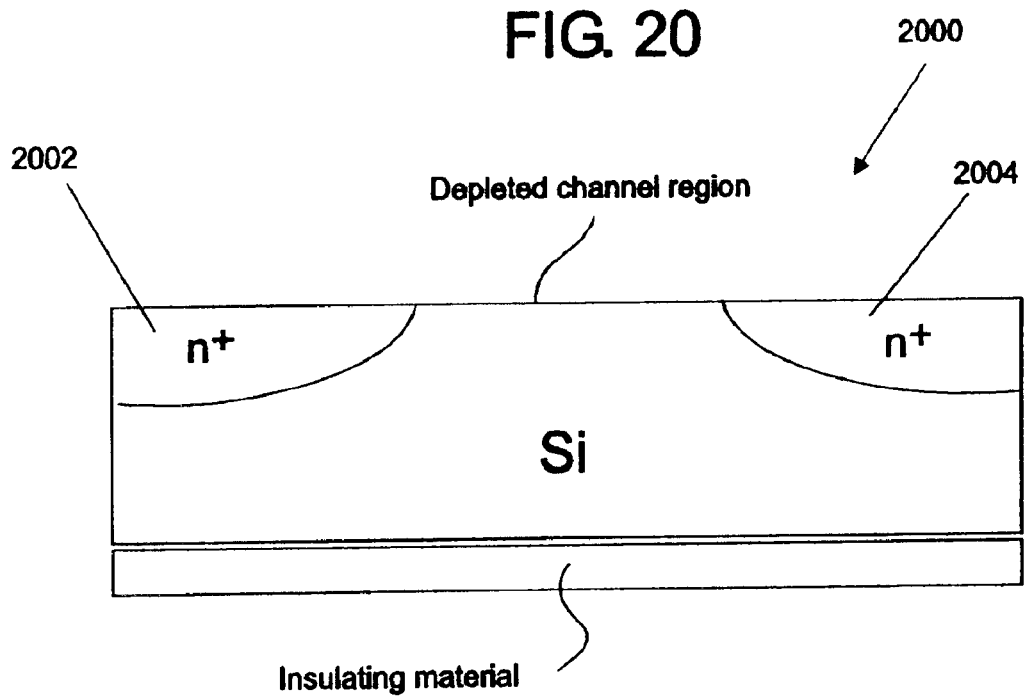
FIG. 20 illustrates an SOI depleted channel host structure that can be used to make devices according to additional embodiments of the invention.

For the next step, methods for placing individual dopant atoms include, but are not limited to: proximity probe manipulation techniques; single ion, low energy, ion implantation methods; and self, surface assisted, and/or directed assembly methods. An example of method of making an atomic chain circuit by placing atoms at predetermined locations was previously discussed. The method is based on recent progress in atom manipulation technology that allows one skilled in the art to move atoms one by one and arrange them as desired. For small-scale production, commercially available, research type proximity probe systems can be used. For mass production, more automated proximity probe manipulators (PPM) may be desirable. Making a deterministically doped FET channel implies placing a specified number of p and/or n dopant atoms at specified locations in the channel region. Thus a PPM can be used for depositing individual n or p type dopant atoms at desired locations on a substrate. This process is illustrated in FIG. 20.

Figure 21:
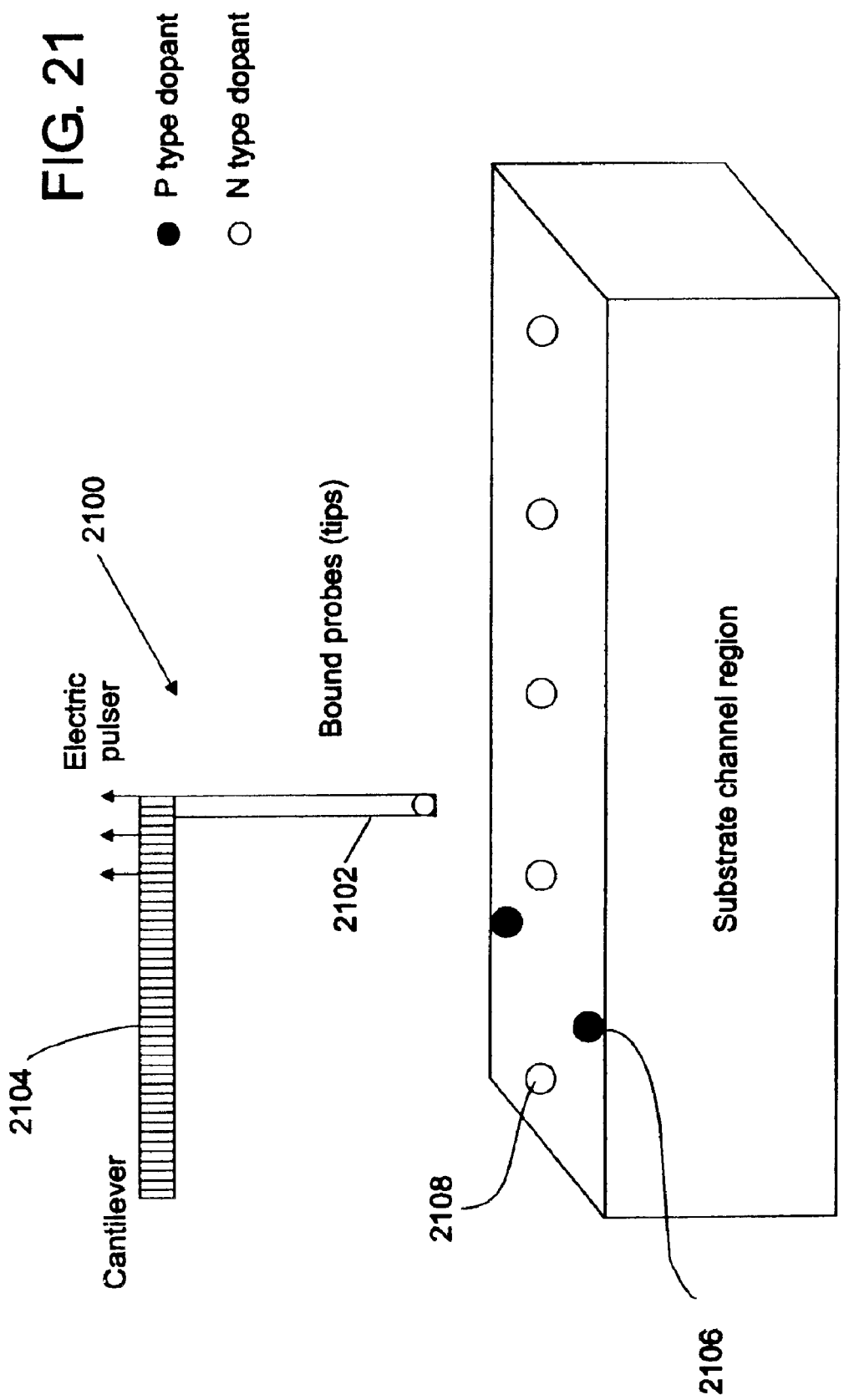
FIG. 21 illustrates one possible fabrication setup, which can be used to make devices according to some embodiments of the present invention.

In FIG. 21, an assembly, 2100, places atoms to form engineered arrays. Carbon nanotube probes (only one probe tip, 2102, is shown for clarity) are used. An addressable multi-probe array can further extend this fabrication technique towards high-yield production. A cantilever 2104 supports the probe system. An electric pulser operates the cantilever. The probes place p-type dopant atoms 2106 and/or n-type dopant atoms 2108 in or on the substrate channel region to form the engineered arrays according to embodiments of the invention. This system enables "stamping" of the engineered arrays. In this example embodiment, engineered arrays are created with both n-type and p-type impurities.

To finish devices, if needed, an epitaxial film of Si is grown by low-temperature molecular beam epitaxy (LTMBE) or low-temperature chemical vapor deposition (LTCVD). The film thickness is one half of the sell size. Subsequently, patterns (e.g. squares) are produced at the surface by a known nanopatterning technique, and the final cell shape is made by dry etching. The surface of the cell then is passivated by few monolayers of a dielectric material, such as $SiO_2$, hydrogen, or $CaF_2$. Finally, the gate structure is fabricated by conventional methods.

Two more detailed example embodiments of a manufacturing method for deterministically doped FET devices are shown in FIGS. 22 and 23. In each case, step numbers are shown in circles, reference numbers are not circled on the drawings. In process 2200 of FIG. 22, at step 1, dopant atoms 2202 are placed on a host cell structure 2204 to form the engineered array, in this example of three atoms. At step 2, an epitaxial film, 2206, of Si is grown by LTMBE or LTCVD. The film thickness in this example is approximately half of the sell size. At step 3, the devices are completed. The source and drain regions may already have been created in the initial host structure, or they may be created at this time. The surface of the cell is passivated by few monolayers of a dielectric material, 2208, such as $SiO_2$, hydrogen, or $CaF_2$. Patterns (e.g. squares) are produced at the surface by any known nanolithographic technique, and the cell shape is made by dry etching. Finally, gate electrode 2210 is formed by conventional methods.

In process 2300 illustrated in FIG. 23, a first dopant atom, 2302, is placed on a host cell structure, such as silicon (Si) substrate 2304, by a PPM technique at step 1. At step 2, an epitaxial film, 2306, of Si is grown by LTMBE with thickness in this example of one third of the sell size and second dopant atom 2308 is placed at the top of the structure at a specified spatial coordinate, which will allow a vertical engineered array to eventually be formed. At step 3, a second epitaxial film, 2310, of Si is grown by LTMBE with thickness of one third of the cell size and third donor atom 2312 is placed at the top of the structure at specified spatial coordinate. A final epitaxial film, 2314, of Si is grown by LTMBE with thickness of one third of the cell size. At step 4, the surface of the cell is passivated by few monolayers of a dielectric material, 2316, such as $SiO_2$, hydrogen, or $CaF_2$. Patterns (e.g. squares) are produced at the surface by one a nanolithographic technique, and the cell shape is made by dry etching. Finally, the gate electrode, 2318 is formed by conventional methods. The devices shown in FIGS. 22 and 23 are examples only. Devices can be made with larger or smaller engineered arrays by increasing or decreasing the number of atoms being placed. In the case of a vertical array like that shown in FIG. 23, the number and thickness of the epitaxial layers is adjusted accordingly. If the device of FIG. 23 is designed so that the source and drain need only be diffused into the bottom layer, the initial substrate already has source and drain regions defined. Otherwise, these can be added before the dielectric is placed.

Again, the precise positional assembly of individual dopant atoms can be achieved by proximity probe manipulation of individual atoms at low temperatures; low voltage ion implantation; directed assembly, surface assisted assembly, and self-assembly methods, and other methods. Typical positional placement precision requirements are approximately a nm. However, the positional placement precision requirements will be determined by the performance tolerance specified for each device. The fixing of the atomic positions of dopants and suppression of their movement can be accomplished by topography or surface driven segregation of dopants and/or surface passivation, electron-irradiation modification of materials properties, or the use of porous materials with controlled shape and distribution of pores, such as porous polymers, porous diamond, and porous calcium fluoride. For example, to construct the horizontal structures shown in FIG. 22, molecular beam epitaxy, MBE, can be used to build up a specified thickness of host material of a silicon lattice. Maskless patterning methods, such as probe lithography, directed assembly such as previously discussed with respect to aluminum atoms on silicon, or low-energy single-ion implantation can be used to position individual dopant atoms at precise locations on the silicon surface. With respect to single-ion implantation techniques, see T. Schenkel et al., "Single ion implantation for solid state quantum computer development," *Journal of Vacuum Science and Technology B*, 20(2002)2819, which is incorporated herein by reference. As described above, MBE continues to build up the thickness of the silicon lattice and embed the dopants at precise locations within this structure. Conventional, holographic or imprint patterning methods can be used to define regions to etch, for isolating individual channel structures. Alternatively, the final etch, a subtractive process, can be eliminated if an MBE resistant region is defined lithographically prior to the first step, described above.

In a similar way, dopant atoms can be arranged colinearly, in a vertical manner, as shown in FIG. 23, by alternating the MBE and maskless patterning steps described above, until the array of dopant atoms (three atoms in the example embodiment) is positioned. Finally, as above, MBE and conventional patterning of the gate dielectric and electrode stack complete the fabrication of this vertical cell.

With the present invention, a single-dopant FET device is created by depositing (a) dopant atom(s) at precise locations on the surface of or within a solid host matrix or lattice. This host structure may embody a variety of shapes and textures. The host structure and the active cell can be thought of as a supermolecular structure. To aid understanding, this system can be conceptualized like other complex quasi-macromolecular structures, such as polymers, proteins or chromosomes.

Consider the case of a host channel cell, $H_{ch}$, as a supermolecular structure, with dopant atoms, of types $Y_1 \ldots Y_k$, precisely positioned as substituents in this supermolecular structure. $Y_{kl}$ corresponds to the $l^{th}$ a dopant atom of dopant type k embedded in a local environment, such that the dopant can either be an electron acceptor or an electron donor. Also, this dopant may be attached, or in close proximity, to a modifying substituent, R, such that $Y_{kl}$= Dopant+R. The following describes a general empirical formula for such deterministically doped supermolecular FET channel type structures:

$$H_i Y_{1j} \ldots Y_{kl}$$

wherein H defines the channel region material; i is a total number of host matrix atoms; Y defines the dopant atom type, with 1 to k dopant atom types; j is the discrete number of dopant atoms of the $1^{st}$ dopant atom type in the engineered array; and 1 is the discrete number of dopant atoms of the $k^{th}$ dopant atom type in the engineered array.

Finally, the positions of, and distances between, dopant atoms are accurately and precisely controlled, with positional tolerances specified for each device. Again, if dopant atoms are placed roughly 5 nm apart, then a typical positional placement precision requirement for each dopant atom in order to create a practical working device is approximately 1 nm.

Specific embodiments of an invention have been herein described. One of ordinary skill in the semiconductor, chemical, and/or electronics arts will quickly recognize that the invention has numerous other embodiments. In fact, many implementations are possible. The following claims are in no way intended to limit the scope of the invention to the specific embodiments described.

What is claimed is:

1. A semiconductor field-effect device structure comprising:
   a host structure further comprising a channel region; and
   an engineered array of at least one impurity disposed at the channel region of the host structure such that a position of each component atom of the engineered array is fixed by atomic scale position control in order to provide substantial control of carrier flow.

2. The field-effect device structure of claim 1 further comprising:
   a source region;
   a drain region;
   a first insulator disposed atop the source region, the drain region, the channel region, and the engineered array; and
   a gate disposed atop the first insulator so that a field-effect transistor is formed from the semiconductor field-effect device structure.

3. The semiconductor field-effect device structure of claim 2 wherein the semiconductor field-effect device structure is comprised primarily of silicon, and further comprising a second insulator disposed beneath the semiconductor field-effect device structure to form a silicon-on-insulator field-effect device.

4. The field-effect device structure of claim 1 wherein the engineered array further comprises at least some of the component atoms arranged substantially in at least one row.

5. The field-effect device structure of claim 4 wherein the at least one row comprises a plurality of rows.

6. The field-effect device structure of claim 1 wherein the engineered array further comprises at least some of the component atoms arranged in a substantially ordered pattern resulting at least in part from self-assembly.

7. The field-effect device structure of claim 2 wherein the engineered array further comprises at least some of the component atoms arranged substantially in at least one row.

8. The field-effect device structure of claim 7 wherein the at least one row comprises a plurality of rows.

9. The field-effect device structure of claim 2 wherein the engineered array further comprises at least some of the component atoms arranged in a substantially ordered pattern resulting at least in part from self-assembly.

10. The field-effect device structure of claim 8 wherein the plurality of rows are disposed at least in part to facilitate uniformity of a source-channel interface and a drain-channel interface.

11. The field-effect device structure of claim 1 wherein the component atoms comprise p-type dopants.

12. The field-effect device structure of claim 1 wherein the component atoms comprise n-type dopants.

13. The field-effect device structure of claim 1 wherein the component atoms comprise p-type dopants and n-type dopants.

14. The field-effect device structure of claim 2 wherein the component atoms comprise p-type dopants.

15. The field-effect device structure of claim 2 wherein the component atoms comprise n-type dopants.

16. The field-effect device structure of claim 2 wherein the component atoms comprises p-type dopants and n-type dopants.

17. A supermolecular structure comprising a host structure and an engineered array of at least one dopant atom disposed at a channel region of the host structure to impart substantial control of a source-drain carrier flow, the supermolecular structure also being described by the formula:

$$H_i Y_{1_j} \ldots Y_{k_l}$$

wherein:
H defines the channel region material;
i is a total number of host matrix atoms;
Y defines the dopant atom type, with 1 to k dopant atom types;
j is the discrete number of dopant atoms of the $1^{st}$ dopant atom type in the engineered array; and
l is the discrete number of dopant atoms of the $k^{th}$ dopant atom type in the engineered array.

18. The supermolecular structure of claim 17 wherein the engineered array further comprises at least some of the at least one atom arranged substantially in at least one row.

19. The supermolecular structure of claim 18 wherein the at least one row comprises a plurality of rows.

20. The supermolecular structure of claim 17 wherein the engineered array further comprises a substantially ordered pattern of at least some of the at least one dopant atom, the substantially ordered pattern resulting at least in part from self-assembly.

21. The supermolecular structure of claim 19 wherein the plurality of rows are disposed at least in part to facilitate uniformity of a source-channel interface and a drain-channel interface.

22. A field-effect transistor comprising:
a source region;
a drain region;
a gate structure;
a first insulator disposed beneath the gate structure and above the source region and the drain region; and
a supermolecular structure disposed beneath the first insulator, the supermolecular structure comprising a host structure and an engineered array of at least one dopant atom disposed at a channel region of the host structure to facilitate substantial control of a source-drain carrier flow, the supermolecular structure also being described by the formula:

$$H_i Y_{1_j} \ldots Y_{k_l}$$

wherein:
H defines the channel region material;
i is a total number of host matrix atoms;
Y defines the dopant atom type, with 1 to k dopant atom types;
j is the discrete number of dopant atoms of the $1^{st}$ dopant atom type in the engineered array; and
l is the discrete number of dopant atoms of the $k^{th}$ dopant atom type in the engineered array.

23. The field-effect transistor of claim 22 further comprising a second insulator disposed beneath the supermolecular structure so that a silicon-on-insulator (SOI) field-effect transistor is formed.

24. The field-effect transistor of claim 22 wherein the engineered array further comprises at least some of the at least one dopant atom arranged substantially in at least one row.

25. The field-effect transistor of claim 24 wherein the at least one row comprises a plurality of rows.

26. The field-effect transistor of claim 22 wherein the engineered array further comprises at least some of the at least one dopant atom arranged in a substantially ordered pattern resulting at least in part from self-assembly.

27. The field-effect transistor of claim 23 wherein the engineered array further comprises at least some of the at least one dopant atom arranged substantially in at least one row.

28. The field-effect transistor of claim 27 wherein the at least one row comprises a plurality of rows.

29. The field-effect transistor of claim 23 wherein the engineered array further comprises at least some of the at least one dopant atom arranged in a substantially ordered pattern resulting at least in part from self-assembly.

30. The field-effect transistor of claim 25 wherein the plurality rows are disposed at least in part to facilitate uniformity of a source-channel interface and a drain-channel interface.

31. The field-effect transistor of claim 28 wherein the plurality of rows are disposed at least in part to facilitate uniformity of a source-channel interface and a drain-channel interface.

* * * * *